United States Patent [19]

Linker

[11] Patent Number: 4,775,279

[45] Date of Patent: Oct. 4, 1988

[54] METHOD AND APPARATUS FOR LOADING/UNLOADING DIP DEVICES

[75] Inventor: Frank V. Linker, Broomall, Pa.

[73] Assignee: American Tech Manufacturing, Inc., Glenolden, Pa.

[21] Appl. No.: 807,531

[22] Filed: Dec. 11, 1985

[51] Int. Cl.⁴ .................... B65G 47/24; B65G 65/23
[52] U.S. Cl. .................... 414/411; 198/388; 198/394; 198/397; 198/401; 198/465.1; 414/404; 414/421; 414/786
[58] Field of Search ............... 414/224, 403, 404, 411, 414/418, 425, 786, 421; 221/104, 105, 108, 111, 11, 103; 140/147; 29/809, 741, 759; 198/394, 395, 397, 388, 401, 410, 465.1, 453, 465.3, 443, 396, 633

[56] References Cited

U.S. PATENT DOCUMENTS

| | | | |
|---|---|---|---|
| 2,581,634 | 1/1952 | Coons | 198/397 X |
| 3,101,832 | 8/1963 | Wyle et al. | 198/395 X |
| 3,276,566 | 10/1966 | Raasch | 198/395 |
| 3,292,765 | 12/1966 | Loveless | 198/396 |
| 3,308,977 | 3/1967 | Cochran et al. | 414/404 X |
| 3,662,881 | 5/1972 | Fineran | 414/404 X |
| 4,099,609 | 7/1978 | Kieronski et al. | 198/397 X |
| 4,194,865 | 3/1980 | Bandoh | 414/403 |
| 4,222,166 | 9/1980 | Kurek et al. | 414/404 X |
| 4,228,864 | 10/1980 | Berger et al. | 414/411 X |
| 4,498,574 | 2/1985 | Fischer | 198/394 X |
| 4,629,387 | 12/1986 | Stillman et al. | 198/394 X |
| 4,647,269 | 3/1987 | Wedel et al. | 414/403 X |
| 4,648,773 | 3/1987 | Bieganski | 414/411 |

Primary Examiner—Joesph E. Valenza
Assistant Examiner—David A. Bucci
Attorney, Agent, or Firm—Eugene E. Renz, Jr.

[57] ABSTRACT

An apparatus for the transfer of DIP devices to or from DIP delivery tubes is shown to include a hopper for the storage of several tubes, an elevator member for removing individual tubes from the hopper and depositing such tubes into a hopper, an orienting member which positions the tube in a predetermined radial orientation and which moves the tube axially in response to a control signal to a head member which receives the radially oriented tube and guides it to a predetermined second orientation for the transfer of DIP devices and which ejects such tubes upon completion and a computer control member for generating the necessary actuation signals to coordinate the transfer of DIP devices and tube ejection. The head member may also be provided with an extracation member to remove any pin or plug which may seal the tube.

19 Claims, 14 Drawing Sheets

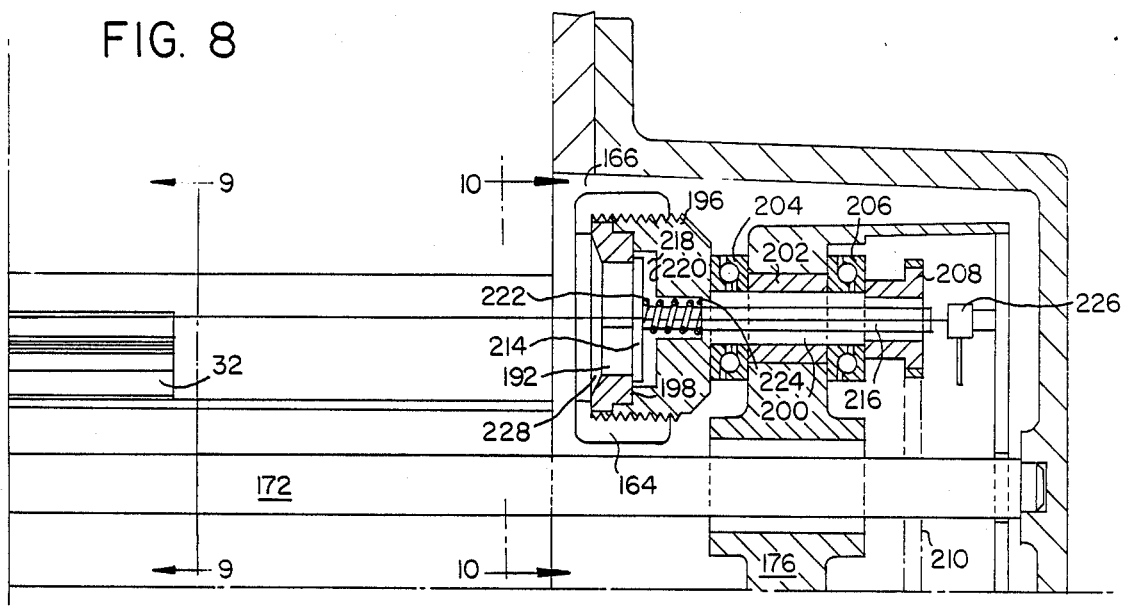
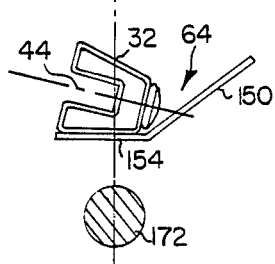
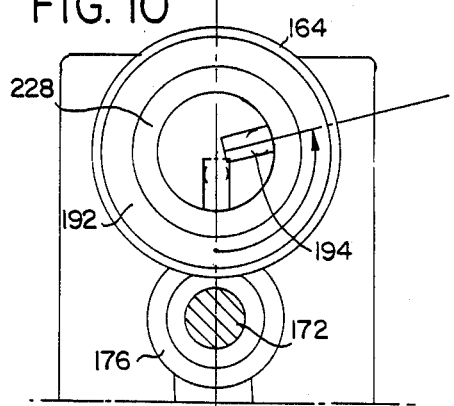
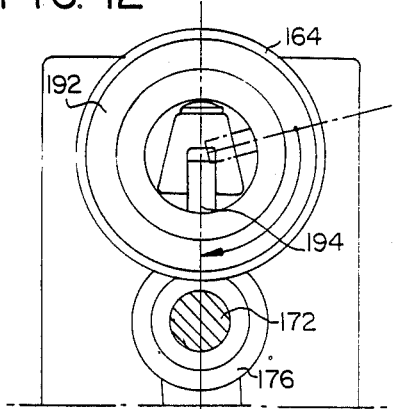
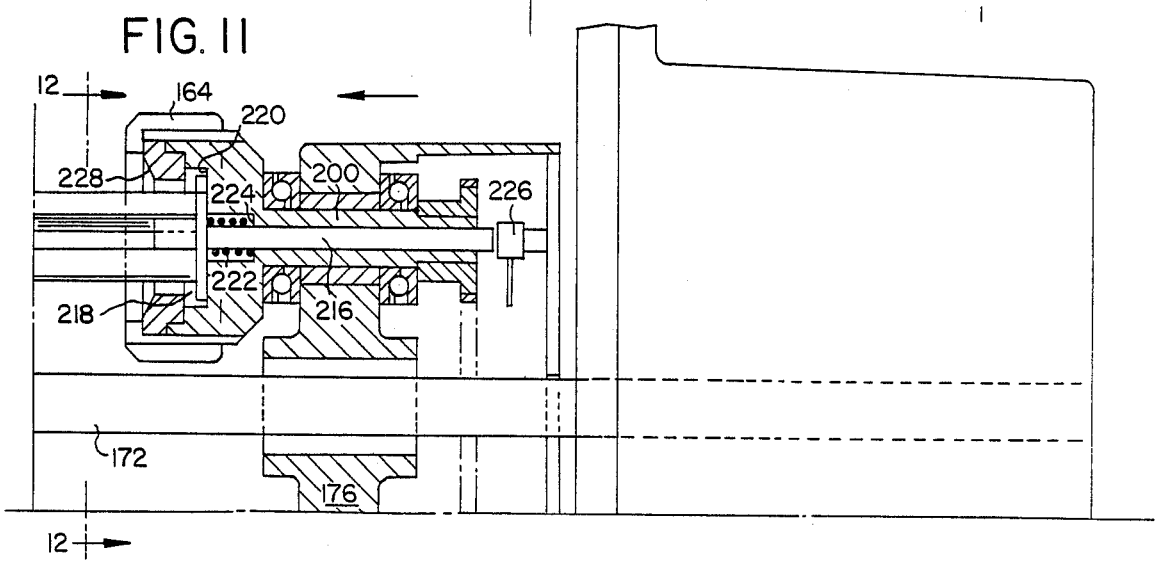

METHOD AND APPARATUS FOR LOADING/UNLOADING DIP DEVICES

FIELD OF THE INVENTION

The present invention relates broadly to a new and novel method and apparatus for handling DIP devices and more particularly to a method and apparatus for transferring DIP devices to or from DIP delivery tubes.

DIP devices are typically comprised of an elongated generally rectangular body portion made of moldable material and having imbedded therein a plurality of leads arranged in rows depending from opposite side edges of the body portion and disposed at a predetermined angular relation thereto. During manufacture, or during assembly onto printed circuit boards (hereafter "PCB"), groups of DIP devices are placed into plastic storage tubes for ease in handling and to prevent damage. Each group generally includes ten (10) or more DIP devices. By plugging the open ends of each tube, the DIP devices are contained until required. The present invention relates to the insertion or removal of such groups of DIP devices to or from such delivery tubes.

BACKGROUND OF THE INVENTION

As is well known in the art, DIP devices consisting of a body portion, and attached and depending leads connected thereto for assembly onto a PCB or the like, are manufactured with the leads disposed in a particular arrangement adapted for insertion in the predetermined array or pattern of holes or sockets in a PCB. The material of the leads and their connection to, and disposition on, the DIP bodies frequently results in a bending or distortion of the leads due to handling during manufacturing operations. By placing DIP devices in plastic delivery tubes some protection is provided. However, such protection is limited.

As a result of the continued bending and distortion, a series of apparatus and methods have been developed to straighten or reorient DIP devices or to determine DIP lead integrity in order to evaluate whether a straightening operation is required. Examples of such DIP lead strightening apparatus and methods are dislcosed in U.S. Pat. No. 3,880,205 for ELECTRONIC COMPONENT LEAD STRAIGHTENING DEVICE AND METHOD, and U.S. Pat. No. 4,481,984 for ELECTRONIC COMPONENT LEAD STRAIGHTENING DEVICE AND METHOD both owned by the assignee of the instant application. Examples of such integrity determination apparatus and methods are disclosed in U.S. patent application Ser. No. 648,872 for APPARATUS AND METHOD FOR LEAD INTEGRITY DETERMINATION FOR DIP DEVICES filed Sept. 10, 1984 and U.S. patent application Ser. No. 735,857 for IMPROVED APPARATUS AND METHOD FOR LEAD INTEGRITY DETERMINATION FOR DIP DEVICES filed May 20, 1985, both of which are owned by the assignee of the instant invention.

Heretofore, such plastic delivery tubes were presented to such and similar apparatus by manually removing a plug from at least one end of each tube and thereafter manually inserting each tube in a receptacle attached to the apparatus. For example, the turret arrangement disclosed in U.S. Pat. No. 4,481,984. Such receptacles are designed to give the tube a predetermined orientation. Additionally, it was known to manually preorient DIP tubes by inserting a number of tubes into a magazine rack-type device. Such magazine rack-type devices typically only held approximately 6-10 tubes at a time. Such manual operation was not only time consuming but also increased the possibility of further damage to the DIP devices.

SUMMARY OF THE INVENTION

The present invention provides a unique apparatus and method for the transfer of DIP devices to or from DIP delivery tubes. Utilizing the present invention, a plurality of DIP tubes can be placed into a hopper in random orientation. Orienting components, provided in the present invention, remove individual tubes from the hopper and orient the tubes to a predetermined radial orientation. In response to a control signal, the oriented delivery tube is moved axially in a direction for insertion into a head member. The head member receives the delivery tube from the orienting components and guides the tube to a predetermined axial orientation. After the transfer of DIP devices, the tube is ejected from the head member. A control member is also provided in the present invention to coordinate the movement of the orienting components and the head member. Such coordination is achieved through the generation of control signals, which signals cause the orienting components and head member to operate.

A further feature of the present invention is the provision of an orienting collar as one of the orienting components. Such orienting collar is provided with an interior surface shaped to receive the end of a DIP delivery tube in only one orientation. The collar is rotated against one end of the tube until the orientation of the interior surface allows for the reception of the tube. The collar is thereafter returned to a home position where such tube will then have a predetermined radial orientation.

A still further feature of the present invention is the provision in the head member of an extracation member for removing the pin or plug which may be present in the delivery tube end. The head member is also provided with a singulator arm for allowing the transfer of only a single DIP device at a time.

A still further feature of the present invention is the provision of a sensor in the head member, connected to the control member, for sensing the transfer of DIP devices and for counting the number transferred. In this manner it can be determined whether a delivery tube is full or empty.

With the foregoing in mind, it is broadly an object of the present invention to provide a new method and apparatus for the automatic transfer of DIP devices to or from DIP delivery tubes.

Another object of the present invention is to provide a method and apparatus for the transfer of DIP devices from a plurality of delivery tubes which need only be placed in a hopper.

Another object of the present invention is to provide a method and apparatus for the transfer of DIP devices which removes one DIP delivery tube at a time from a hopper and orients such tube to a predetermined radial orientation.

Another object of the present invention is to provide a method and apparatus for the transfer of DIP devices which includes a head member, adapted to receive delivery tubes, and for orienting such tubes to a predetermined axial orientation.

It is yet another object of the present invention to provide a new method and apparatus for handling DIP devices which minimizes the potential for damage to such DIP devices during manufacture and assembly.

BRIEF DESCRIPTION OF THE DRAWINGS

These and other objects of the present invention and the various features and details of the operation and construction thereof are hereinafter more fully set forth with reference to the accompanying drawings, wherein:

FIG. 1a is an isometric view of a cartridge-sealing plug, a DIP device, a DIP delivery tube and a cartridge sealing pin;

FIG. 8 is a partial sectional view in side elevation of the orientor station of the present invention;

FIG. 9 is a sectional view along line 9—9 of FIG. 8 showing a DIP-delivery tube in random alignment within the orientator station trough;

FIG. 10 is a sectional view along line 10—10 of FIG. 8;

FIG. 11 is a partial sectional view in side elevation of the orientor station with the delivery tube engaged in a predetermined radial orientation;

FIG. 12 is a sectional view along line 12—12 of FIG. 11;

DESCRIPTION OF THE PREFERRED EMBODIMENTS

Figure 1:
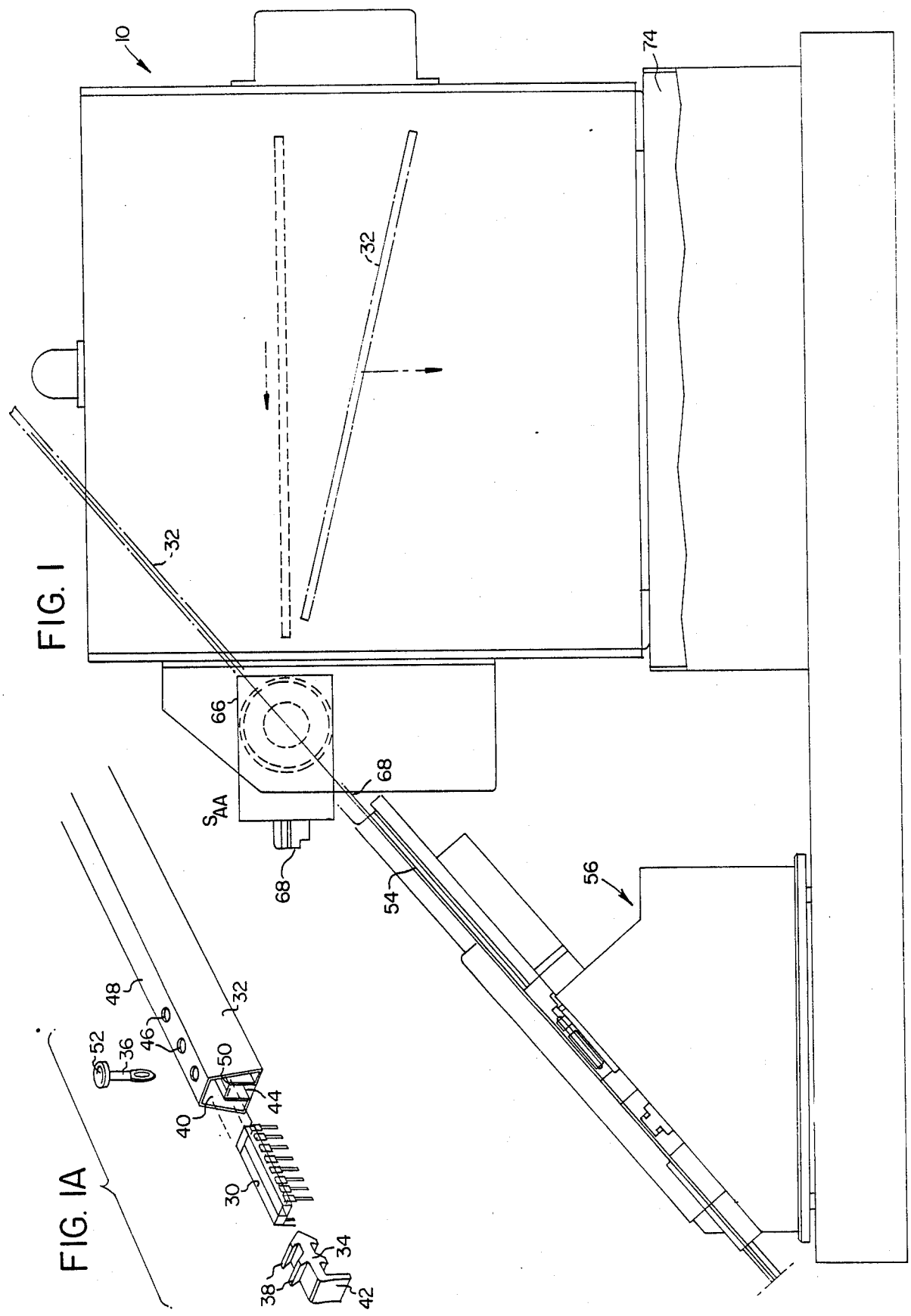
FIG. 1 is a view in side elevation of the present invention in position adjacent a DIP leading scanning device and operating in conjunction with said scanning device.

The system and apparatus of the present invention are adapted for loading or unloading DIP devices, i.e. the transfer of DIP devices to or from plastic delivery tubes.

FIG. 1a shows a single DIP device 30 and a hollow delivery tube 32 of A-shaped cross section within which several DIP devices may be stored in abutting end-to-end relation. DIP devices, having a plurality of leads embedded into a generally rectangular body portion, are inserted into the tube to provide ease of handling and to prevent damage especially to the leads. Each axial end of the tube is sealed with either plug 34 or pin 36. to seal with plug 34, the tip which contains several projections 38 for frictional engagement, is inserted fully into the DIP body receiving portion 40 of the A-shaped tube. After insertion, the plug tail 42 is positioned over slot 44 in tube 32. To seal with a pin, pin 36 can be inserted into any of a series of holes 46 located in the top surface 48 of tube 32. Each hole is aligned with an identical hole in cross surface 50. Holes 46 are spaced along the longitudinal centerline at each end of the tube. The pin is fully inserted until head 52 is resting on top surface 48. The tip of pin 36 is radially bowed to frictionally engage the hole in cross surface 50.

The present invention can be operated to manipulate either tubes filled with DIP devices for the transfer of single DIP devices onto the trackway of a further apparatus for operation thereon or for the presentation of empty cartridges to the discharge trackway of such further apparatus for receipt of DIP devices and to remove the tube when full.

The method of the invention will be presented hereinafter in conjunction with the description of apparatus and its capacity for loading DIP devices onto the trackway of separate DIP device testing apparatus.

Figure 2:
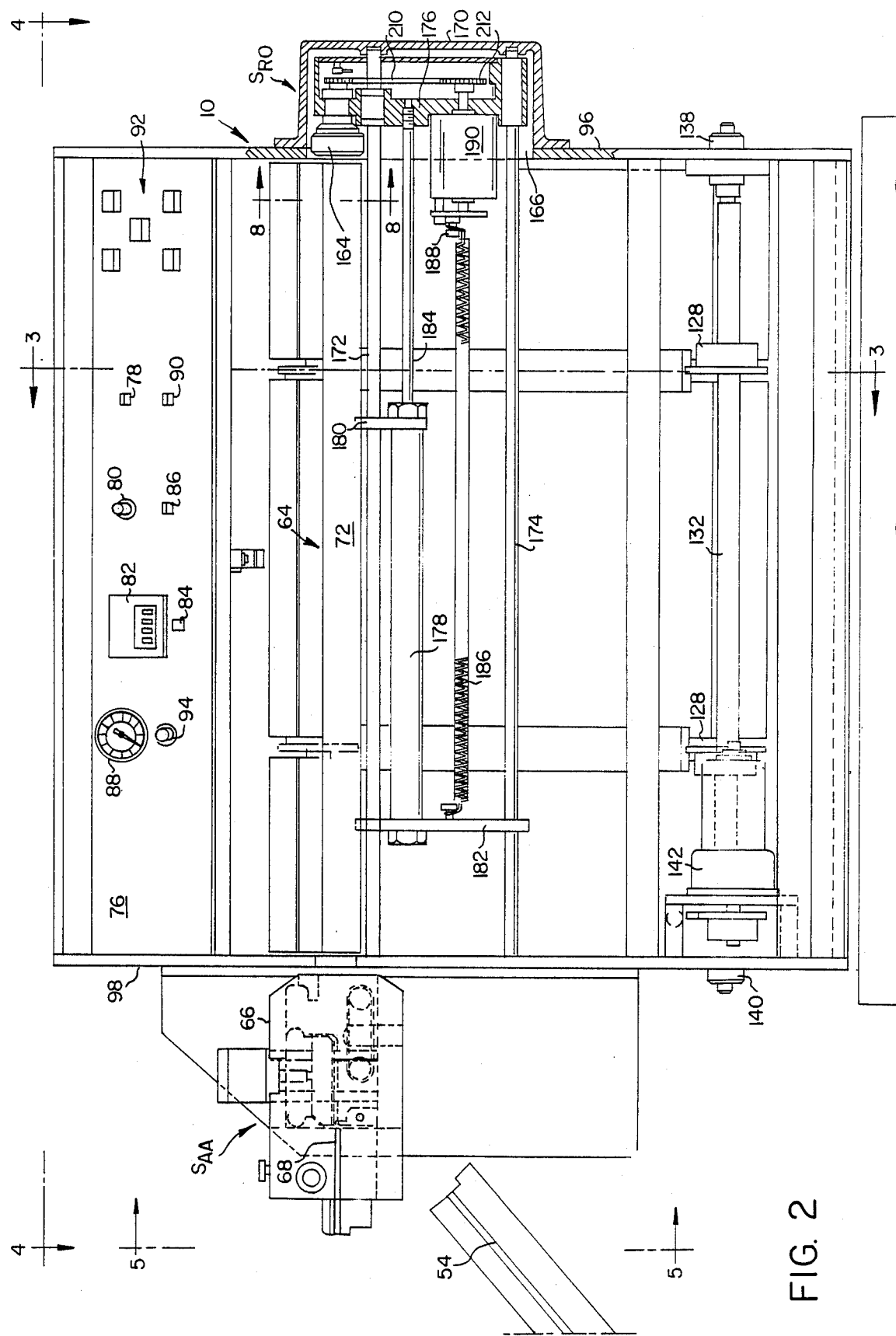
FIG. 2 is a view in side elevation of the orientor station, a portion of which is shown in section, and an instrument control panel of the present invention.
Figure 3:
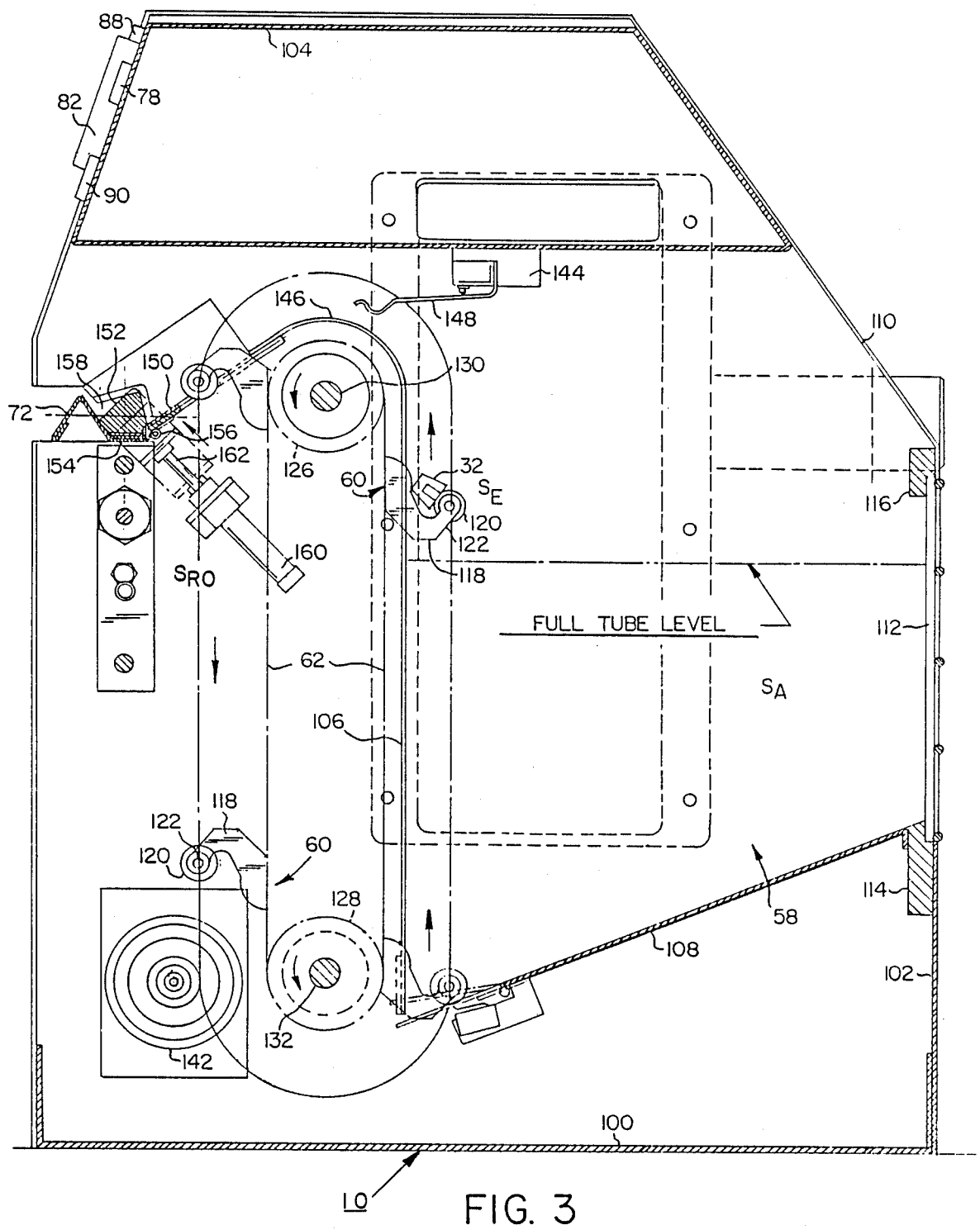
FIG. 3 is a sectional view along line 3—3 of FIG. 2.

A general understanding of the basic structure and operation of the apparatus of the present invention may be gained by several of the views which best show the basic components of the apparatus and operation thereof such as FIGS. 1-4. Considering first the basic components of the loading apparatus in terms of interrelated functions, the apparatus generally designated 10 as shown in FIG. 3 includes an accumulator station or hopper $S_A$, an elevator station $S_E$ which removes one tube at a time from the accumulator station and presents such tube to radial orientation station $S_{RO}$ (see FIG. 2). In the orientor station, the delivery tube is given a predetermined radial orientation. Located adjacent orientor station $S_{RO}$ is the axial alignment station $S_{AA}$, where the delivery tubes is inclined to a predetermined axial orientation. As shown in FIGS. 1 and 2, such predetermined axial orientation results in the alignment of tube 32 with trackway 54 of the integrity determination and straightening apparatus generally designated 56.

Tracing now briefly a typical cycle of operation, tube 32 filled with DIP devices and sealed at both ends with either pins 36 or plugs 34 are manually loaded into hopper 58, shown in FIG. 3. The cartridges as loaded are arranged in a longitudinal cluster. Information is entered into a computer control member which coordinates the movements and interrelationship of the various stations described herein. Such information includes specifying the number of DIP devices per tube, the number of leads per DIP device and whether the cartridge is sealed at both ends with pins or plugs.

Figure 4:
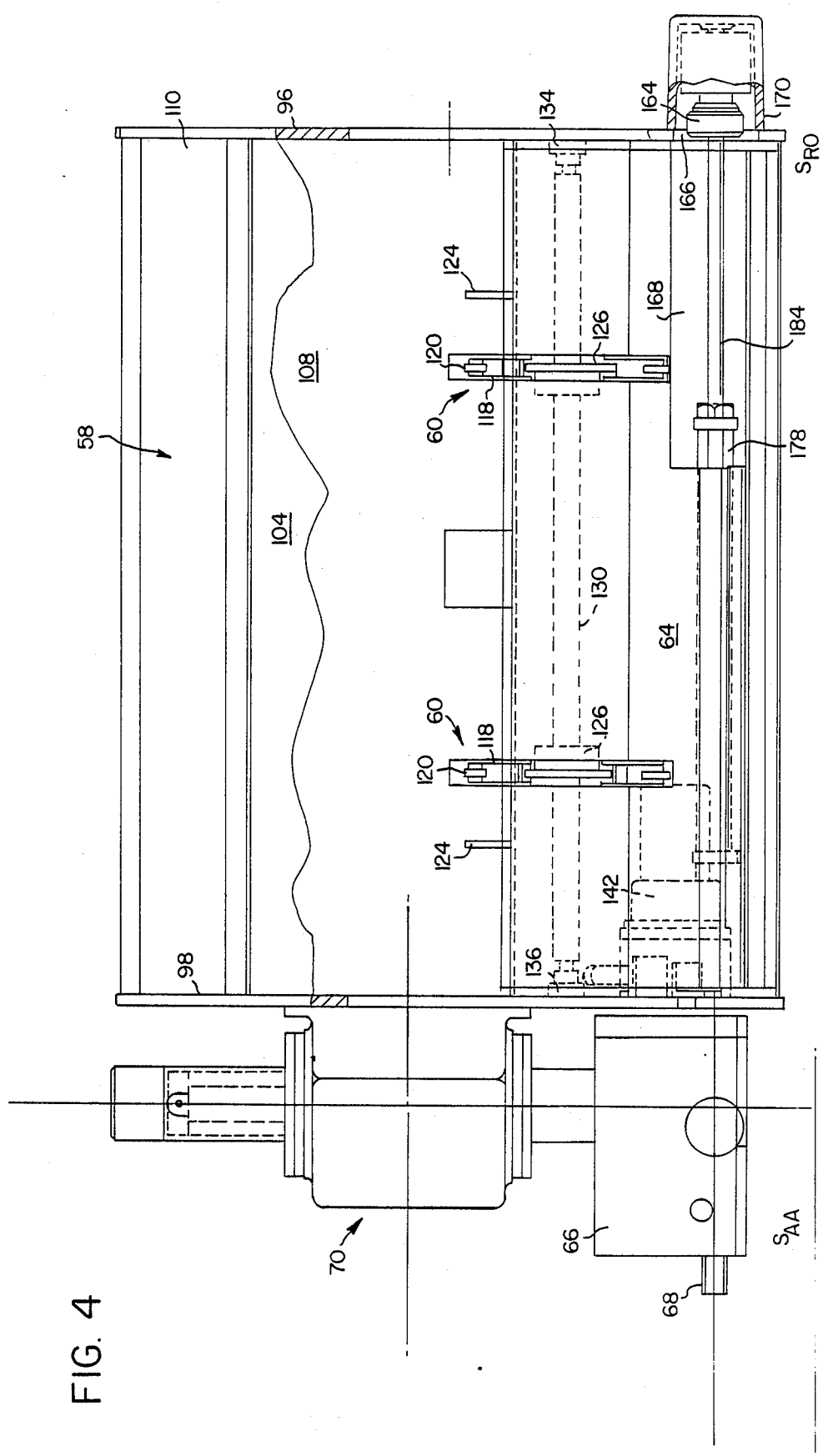
FIG. 4 is a sectional top plan view along the line 4—4 of FIG. 2.

As shown in FIGS. 3 and 4, several pairs of hooks 60 are attached to conveyor chain 62 (shown as a dot and a dashed line in FIG. 3). These major components of elevator station $S_E$ operate to convey a single cartridge from hopper 58 to the trough 64 of radial orientation station $S_{RO}$. Within the orientation station the orientation assembly engages one end of the tube 32 and adjusts the rotational alignment, i.e. radial orientation, of the tube. The orientor assembly pushes the free end portion of the length of now radially aligned tube 32 into axial alignment station $S_{AA}$. Upon entry of the pre-sealed tube, the alignment assembly 66 removes the pin or plug from the tube end. Having removed pin 36 or plug 34, the open end of tube 32 abuts one end of an inner trackway 68 which has a length about half that of alignment assembly 66.

Alignment assembly 66, having grasped tube 32, is traversed by arm 70 to a second position wherein tube 32 is moved generally horizontally to a position outside trough 64. As it moves forward, tube 32 deflects pivotally attached trough sidewall 72. When in such second position, inner trackway 68 of alignment assembly 66 should then lie in the same plane with trackway 54 of the separate DIP-testing device 56.

Alignment assembly 66 is rotated by arm 70 counter-clockwise to an angle of about 400°, from horizontal as shown in FIG. 1 forcing the exposed length of tube 32 upwards. After rotation of alignment assembly 66, the outermost end of inner trackway 68 engages trackway 54 of separate DIP testing device 56 as shown in FIG. 1.

DIP devices are gravity fed onto inner trackway 68 and initially encounter a singulator system $S_s$ (shown and described in greater detail in connection with FIG. 14) wherein hold-down and detent means function to release DIP devices one at a time so that only a single DIP device will travel on tackway 54 at any one time.

Once all DIP devices have been transferred from tube 32, either the pin-pull mechanism re-inserts pin 36 into the tube or plug 34 is re-inserted. Once an empty tube is closed, alignment assembly 66 ejects that tube. Since alignment assembly is still in the second position, a bin 74 appropriately placed at the foot of loading apparatus 10 catches and accumulates ejected tubes. After tube ejection, the alignment assembly returns to a "home" position wherein it is aligned to receive the next tube present in orientation station $S_{RO}$.

Suitable controls, including circuitry to be described in more detail hereafter, are provided in a computer control member for effecting operation of the loading apparatus in the manner broadly described above. As shown in FIG. 2, a control panel 76 is mounted on the face of apparatus 10 within easy view of the operator and includes the various automatic and manual operating controls for the electronic and pneumatic control systems. These include power-on switch 78 which activates the computer control member, multi-position dial switch 80 for setting the known number of leads per DIP device which in the preferred embodiment includes three positions representing 8, 28 and 48 leads respectively, counter mechanism 82 for setting the known number of DIP devices per tube, reset button 84 for resetting counter mechanism 82, switch 86 for setting pin or plug pull, air pressure gauge 88 for measuring the air pressure in the pneumatic system, cycle start switch 90 for manually starting or stopping an operating cycle, a series of fuses 92 and an indication light 94 for indicating when orentor station $S_{RO}$ is feeding a tube into alignment assembly 66, all of which will be described in further detail herein.

Turning now to a more detailed description of the components generally described above, FIGS. 2, 3 and 4 show apparatus 10 to include a housing broadly refined by side walls 96 and 98, base 100, front wall 102 and top 104. Top 104 serves to house the computer control member. Within the confines of this housing is hopper 58 which is further defined by rear wall 106 and bottom wall 108. As shown in FIG. 3, wall 108 is inclined so that tubes placed in hopper 58 through opening 110 will fall to the joint where walls 106 and 108 meet. In the preferred embodiment, front wall 102 is provided with a transparent section 112 to enable a user to determine whether hopper 58 is empty. Section 112 is attached to front wall 102 by mounting brackets 114 and 116 which are secured to either front wall 102 or side walls 96 and 98 by any suitable means.

Tubes 32 are removed from hopper 58 by the elevator station $S_E$. As previously described, the elevator station $S_E$ includes pairs of hooks 60 attached to a conveyor chain 62. As shown in FIGS. 3 and 4, each hook 60 includes a hookshaped body member 118 having one end attached to chain 62 and having roller 120 rotatably mounted to the other end by pin 122. The body member/roller assembly is sized to only accept one tube 32. If more than one tube is removed by a pair of hooks 60, spring projections 124 serve to knock the excess tubes back into hopper 58.

Chain 62 is mounted on toothed gears 126 and 128, which in turn are mounted on shafts 130 and 132, respectively. As will be appreciated from FIGS. 2 and 4, a pair of chains 62 and associated toothed gears are provided so that a tube 32 may be elevated from hopper 58 in a generally horizontal orientation between a pair of hooks 60. Shafts 130 and 132 are rotatably mounted between side walls 96 and 98 by means of bearings 134, 136 and 138, 140, respectively. Rotation is provided to shaft 132 by elevator motor 142 through a suitable gear arrangement. Thus, activation of elevator motor 142 by the computer control member results in the removal of a tube 32 from hopper 58.

To ensure that only one tube 32 is in orientor station $S_{RO}$ at a time, a switch 144 is provided. Switch 144 is attached above the top curved segment 146 of rear wall 106. Switch 144 is provided with an arm 148 which extends into the path of tubes 32 traveling in the elevator station. Thus, a tube striking arm 148 sends a signal to the computer control member that a tube is about to pass over curved segment 146 and into trough 64. The computer control member can thus stop elevator motor 142, preventing tube 32 from entering trough 64.

As shown in FIG. 3, trough 64 is defined by side wall 72, inclined side wall 150, side wall 96 and stopper plate 152. The openings in side wall 106, bottom 108 and curved segment 146, to allow the protrusion of hook bodies 118, are continued in side wall 150. Since tubes 32 fall onto bottom segment 154 of side wall 72 and are thereby offset from hooks 60, hooks 60 can pass out of trough 64 while tubes 32 remain.

As previously indicated, side wall 72 is pivotally attached to trough 64. Such pivotal attachment, shown in FIG. 3, is achieved by securing bottom 154 to side wall 150 by a hinge and spring arrangement. Since such hinge and spring arrangement is deemed known, only hinge pin 156 is shown in FIG. 3.

One end of trough 64 is defined by stopper plate 152. Stopper plate 152 serves to prevent tubes 32 from passing from trough 64 through opening 158 in side wall 98 to alignment assembly 66 until the appropriate time in each cycle. Stopper plate 152 is moved toward and away from opening 158 by double-acting air cylinder 160 through movement of piston 162 to which the stopper plate is attached. Thus, when the computer control member determines the appropriate time for passage of a tube 32 from trough 64, a signal is generated which serves to actuate cylinder 160 retracting 162 and moving stopper plate 152 away from opening 158.

As described above, once a tube 32 falls from elevator station $S_E$ into trough 64, it is given a predetermined radial orientation by orientation station $S_{RO}$. As shown in FIGS. 2-4 and more particularly in FIGS. 8-11, orientor station $S_{RO}$ operates to position an orienting collar 164 on the end of tube 32 opposite stopper plate 152. The orientor assembly moves collar 164 onto the end of tube 32 by first passing through opening 166 in side wall 96 and into slot 168 in the bottom of trough 64. A cup-shape cover 170 is mounted to side wall 96 over opening 166 to protect the orientor components. The orientor assembly is slidably mounted on rods 172 and 174 by mounting bracket 176. Rods 172 and 174 are securely attached at each end to side wall 98 and cover 170. Thus, by moving bracket 176 axially along rods 172 and 174, the orientor assembly is moved towards and away from stopper plate 152. To this end, a double-acting air cylinder 178 is mounted in a fixed position relative to rods 172 and 174 by mounting plates 180 and 182, which plates are secured to rods 172 and 174 by any suitable means which prevents axial movement thereon. Piston 184 is provided with threads at its far end, which end is screwed into a suitably threaded bore in bracket 176. Since the application of a relatively softer force by station $S_{RO}$ on the end of tube 32 is desirable, spring 186 is mounted between bracket 182 and bracket 176. Spring 186 is operable upon bracket 176 through its attachment to post 188 attached to orientor cylinder 190 which in turn is securely attached to bracket 176. Thus, after piston 184 has been extended, spring 186 serves to initially slide mounting bracket 176 axially on rods 172 and 174 moving orientor station $S_{RO}$ towards stopper plate 152. As will be later explained, when it is desirable to apply greater force on tube 32, piston 184 is retracted.

Consider next the detailed function and operation of orientor collar 164. FIG. 9 shows a tube 32 which has fallen into trough 64 in a random orientation. As was explained with reference to FIG. 1a, tube 32 is generally A-shaped having a slot 44, which slot will always be positioned between the rows of DIP leads. It is the orientation object to position collar 164 over tube 32 so that a fixed reference of collar 164 is positioned in slot 44. to this end, collar 164 is provided with an inner ring 192 having a radially inwardly directed key 194. Key 194 is sized to fit within slot 44 and with relationship to the inner radius of ring 192 is sized to allow ring 192 and thus collar 164 to pass over tube 132.

Rotation of collar 164 results in rotation of ring 192 and key 194. Such rotation is effected through the structure shown in FIGS. 2 and 8. Collar 164 is shown to be internally threaded and mounted on the end of suitably threaded body 196. Ring 192 is fixed in relation to collar 164 by its frictional engagement between collar 164 and shoulder 198 formed in the end face of body 196. Body 196 is formed on a hollow shaft 200 which is rotatably mounted to bracket 176 through opening 202 by bearings 204 and 206. A toothed gear 108 is fixed to the end of shaft 200. Chain 210 connects gear 208 to gear 212 which in turn is securely attached to the shaft of rotary air cylinder 190. Thus, operation of cylinder 190, resulting from an appropriate signal from the computer control member applying air thereto, effects the rotation and direction of rotation of ring 192. Application of "return" air will generate the return of the cylinder shaft to an initial, i.e. "home", position. If collar 164 and ring 192 are in position around tube 32, generation of such "return" rotation results in the rotation of tube 32 to a fixed, i.e. "home", radial orientation. In the preferred embodiment such fixed position is that shown in FIG. 12.

As may already be apparent, the orientation process involves positioning collar 164 around tube 32 and rotating tube 32 to a fixed "home" radial orientation. Collar 164 is positioned around tube 32 in the following sequence. After tube 32 has dropped into trough 64, the computer control member stops pressurized air from entering cylinder 178. Spring 186, which is tensioned by the extension of piston 184, forces bracket 176, and thus the orientor assembly, towards stop plate 152. While bracket 176 is moving, cylinder 190 begins to rotate, resulting in the rotation of ring 192. As the now rotating ring 192 moves through slot 168 in trough 64, it strikes one end of tube 32 and forces the opposite end against stop plate 152. With tube 32 held axially stationary between stop plate 152 and ring 192, ring 192 continues to rotate until key 194 is aligned with slot 44. Upon alignment, spring 186 forces the axial movement of collar 164 and ring 192 onto tube 32. Ring 192 continues its rotation until the end of tube 32 passing through ring 192 contacts base 214. Base 214 is fixed to the end of shaft 216 which extends through, and is axially slidable in relation to, the hollow central portion of shaft 200. Base 214 is positioned in chamber 218 of body 196, which chamber is defined by the back surface of ring 192 and body shoulder 220. Base 214 is biased against the back surface of ring 192 by spring 222, which is positioned around shaft 216 and which has one end against base 214 and the other end against shoulder 224 of body 196. The striking of base 214 by tube 32 forces the opposite end of shaft 216 towards proximity switch 226. When the axial movement of base 214 is stopped by shoulder 220, as shown in FIG. 11, the end of shaft 216 is sufficiently close to proximity switch 226 to cause the generation of a signal to the computer control member. Thus, the computer control member is provided a signal reflective of the positioning of key 194 in slot 44, whereby the counter-clockwise rotation of collar 164 shown in FIG. 10 is halted and the clockwise or return rotation to the "home" radial orientation of collar 164 is initiated. As shown in FIGS. 8 and 11, ring 192 is provided with a radially inwardly tapered surface 228 to facilitate the alignment of key 194 with slot 44.

As indicated, after tube 32 has been radially oriented by the previously described orientor, station $S_{RO}$ and after stop plate 152 has been removed and tube 32 inserted into head or alignment assembly 66, an operation yet to be described, the head member or alignment assembly is moved to a second position, whereby tube 32 is moved out of trough 64. Such movement is achieved by arm assembly 70, generally shown and designated in FIG. 4. As shwon in FIG. 5, arm 70 is contained in housing 230, which is bolted or otherwise securely attached to side wall 98. The movement of head member 66 is basically the result of the axial and radial movement of arm 232.

Figure 5:
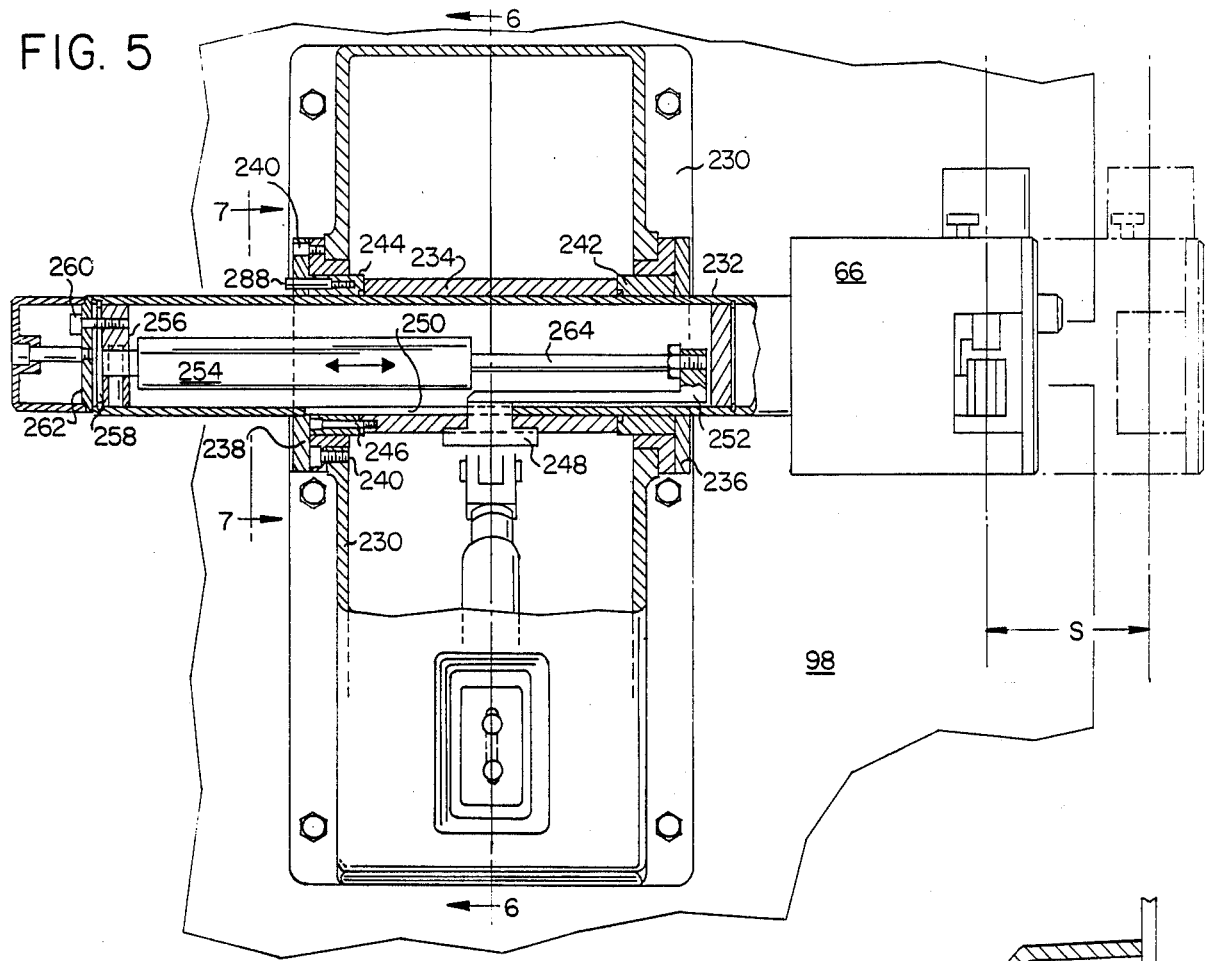
FIG. 5 is a partial sectional view in side elevation of the (downstream) side of the head assembly.

Arm 232 is positioned within sleeve 234, which in turn is held axially fixed within housing 230 by end plates 236 and 238 which are securely attached to housing 230 by bolts 240. As shown in FIG. 5, end plates 236 and 238 actually restrain axial movement of collars 242 and 244, respectively. Collars 242 and 244 are, in turn, securely attached to sleeve 234 by bolts 246. Base bracket 248 extends through and is securely attached to sleeve 234. Bracket 248 additionally extends through slot 250 in arm 232 and has an end plate 252 displaced axially therein. A double-acting air cylinder 254 is securely attached at one end to crosspiece 256. Crosspiece 256 is fixed against a ring 258 fitted proximate the end of arm 232. The fixation of crosspiece 256 occurs by passing bolt 260 through end plate 262 and into the crosspiece. Piston 264 is provided with a threaded end which is shown screwed into a suitably threaded bore in end plate 252. Thus, it will be seen that retraction of piston 264, in response to a signal from the computer control member, results in axial extension of arm 232 moving head member 66 to a second position shown in dot/dashed form in FIG. 5. Extension of piston 264 results in the return of head member 66 to its first "home" position. It will be noted that the distance S of axial displacement is determined by the length of movement of slot 250 around that portion of bracket 248.

Figure 6:
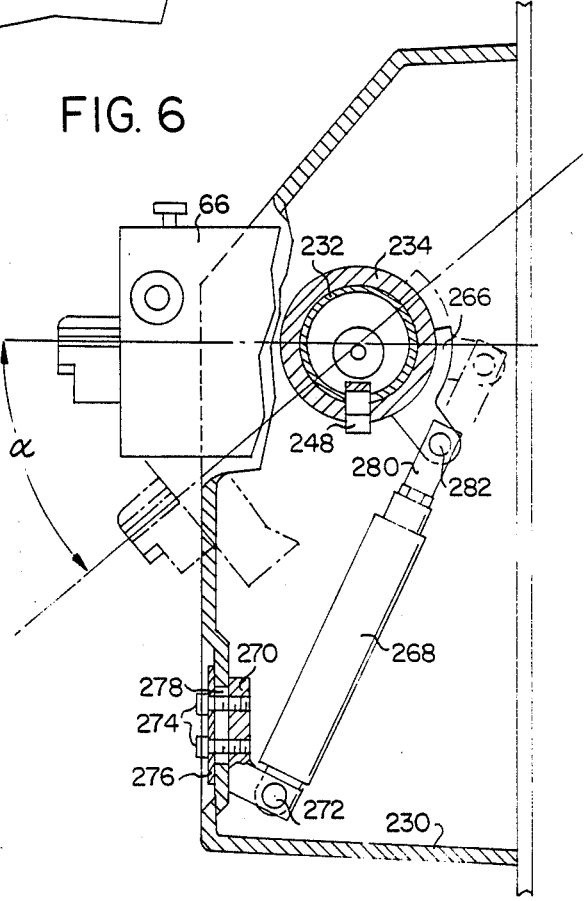
FIG. 6 is a sectional view along line 6—6 of FIG. 5.

Rotation of arm 232 and thus head member 66 is accomplished largely through the structure shown in FIG. 6. A bracket 266 is securely attached to sleeve 234. It will be appreciated that bracket 248, while allowing axial movement of arm 232, acts as a key between sleeve 234 and arm 232 in relation to rotational movement. Thus, rotation of sleeve 234 also serves to rotate arm 232. A double-acting air cylinder 268 is pivotally attached at one end to mounting bracket 270 by pin 272. Bracket 270 is attached to housing 230 by passing bolts 274 through plate 276, slot 278 and into suitably threaded bores in bracket 270. The end of piston 280 is pivotally attached to bracket 266 by pin 282. Extension or retraction of piston 280 results in the rotational movement of sleeve 234 and thus, arm 232 and head member 66.

Figure 7:
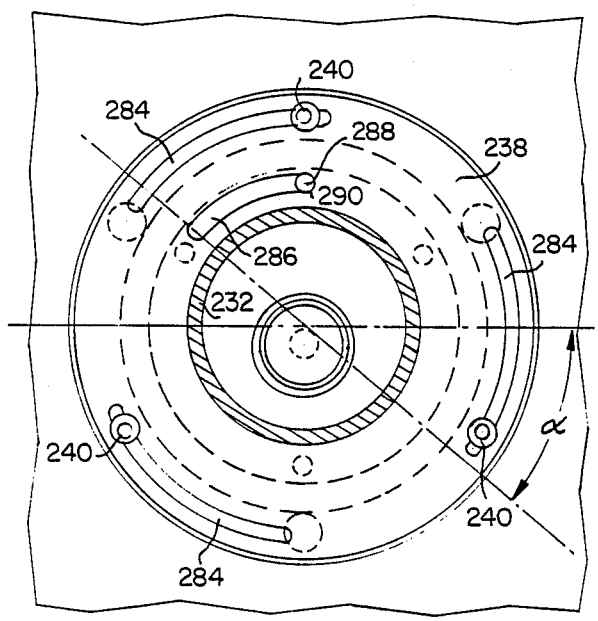
FIG. 7 is a sectional view along line 7—7 of FIG. 5.

As previously indicated, it is desirable to rotate head member 66 to a position where trackway 76 is in alignment with a trackway of a separate device. The example given was an angle of 40°. This angle is fixed by the structure of end plate 238 shown in FIG. 7. Plate 238 is provided with several outer arcuate slots 284 through which bolts 240 pass and attach the plate to housing 230. An inner arcuate slot 286 is provided which allows for the arcuate travel of pin 288. As shown in FIG. 5, pin 288 is securely attached to end collar 244. Since collar 244 is fixed in relation to sleeve 234 by bolt 246, the rotational movement of sleeve 234 is restricted by end 290 of slot 286. When piston 280 is retracted, pin 288 will be in the dashed position shown in FIG. 7, having moved in an arcuate path of equal degrees alpha will be increased. The limit on alpha is the arcuate length of slot 286. The loosening of bolts 274 allows for the adjustment of bracket 270 and thus the return position of piston 280 and resulting orientation of head assembly 66.

Having described the structure for transverse and rotational movement of head member 66, now consider in detail the novel construction and arrangement of various components included in such assembly. As shown in FIGS. 13-18, head member 66 is basically rectangular shaped having a tube input end 292 and a DIP device output end 294 which has trackway 68 projecting therefrom. As was previously described, after radial orientation of tube 32 to a "home" position, stop plate 152 is moved away from opening 158. Simultaneously, piston 184 is retracted, axially sliding orienting station $S_{RO}$ which consequently forces tube 32 through opening 158 into head member opening 296. For the insertion of tube 32 into head member 66, it is preferred that a force greater than spring 186 be utilized. Consequently, piston 184 is retracted.

Figure 13:
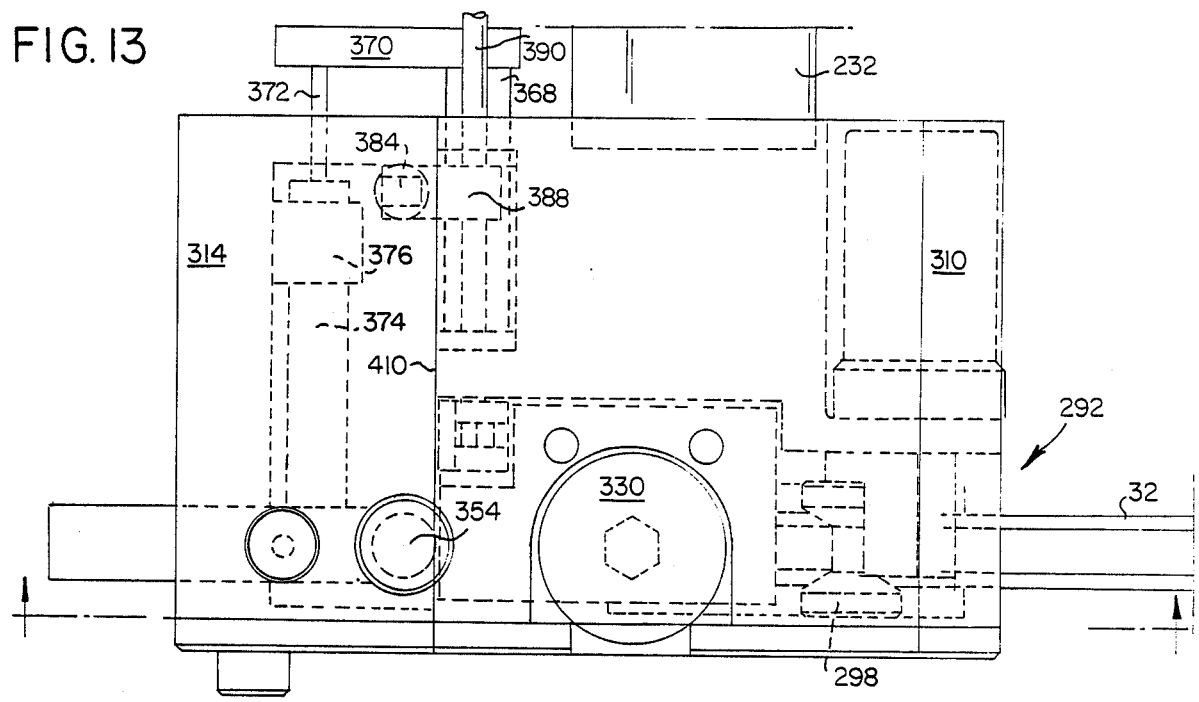
FIG. 13 is a top plan view of the head assembly.
Figure 14:
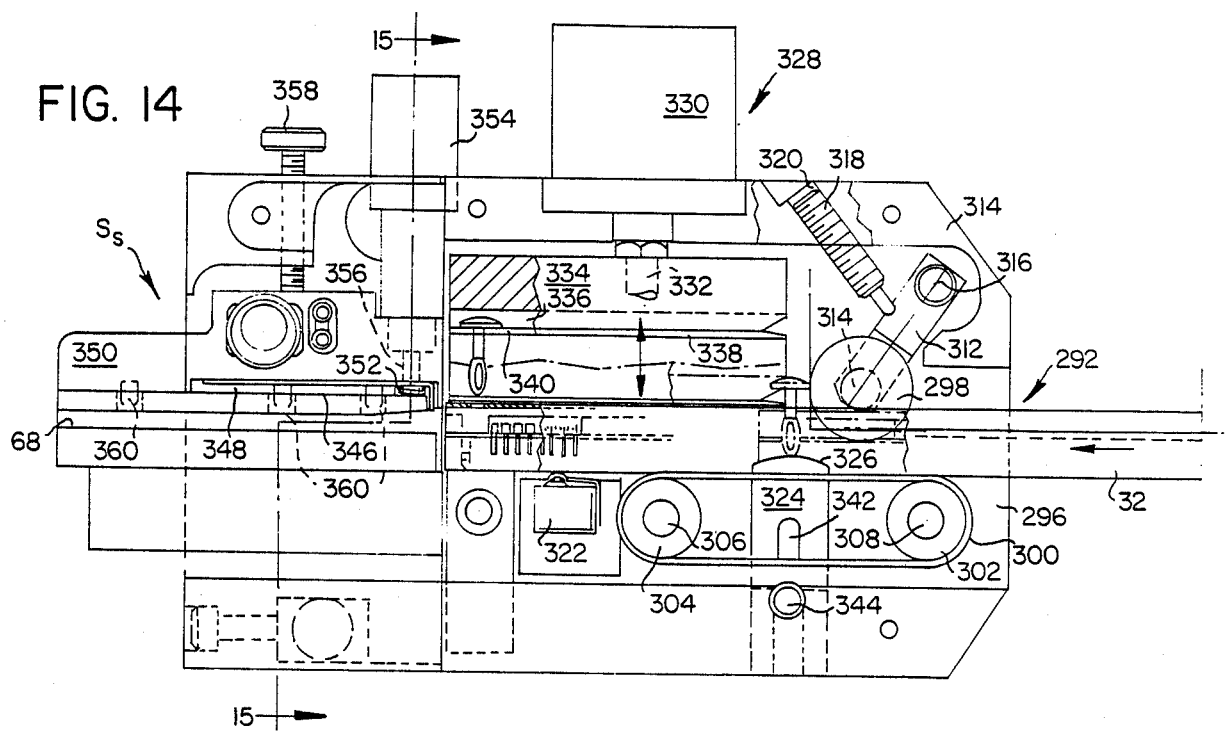
FIG. 14 is a partial sectional in side elevation of the head assembly.

Upon insertion, tube 32 is pressed between spool 298 and belt 300. Belt 300 as shown in FIG. 14 passes around wheels 302 and 304. Wheel 304 is rotatably mounted on pin 306 while wheel 302 is securely attached to shaft 308 of insertion/ejection motor 310, shown in dashed lines in FIG. 13. Motor 310, which is activated by the computer control member, moves belt 300 in a direction which either pulls tube 32 into head member 66 or ejects tube 32 therefrom. Spool 298 is rotatably mounted to bracket 312 by pin 314. As shown in FIG. 13, spool 298 is formed with tapered inner surfaces to more closely conform to the A-shaped DIP delivery tube. Bracket 312 is pivotally mounted to the frame 314 of head member 66 by pivot pin 316. The pivoting of bracket 312 is restricted by pin 318. Pin 318 is threaded along its length and is mounted in a suitably threaded bore 320 in frame 314. By turning pin 318, restraint can be placed on bracket 312 resulting in spool 298 directing more or less force onto tube 32 in relation to belt 300. Tube 32 is pulled into the head member by the operation of motor 310 until the tube strikes switch 322. Switch 322 sends a signal to the computer control member which after an appropriate relay stops motor 310, halting tube 32 at a predetermined location.

As tube 32 is entering head member 66, the computer is set to indicate whether a pin or a plug is to be removed from the end of tube 32. FIG. 14 shows that a pin is to be removed. Upon entry, tube 32 is forced to pass over finger 324 which is shown as having a rounded top surface 326. As pin 34 passes over finger 326, the tip rides onto surface 326 forcing the pin head 52 slightly upward from the top surface 48 of tube 32. In this slightly raised orientation, pin head 52 can be grasped from beneath by the pin pulling assembly 328. Assembly 328 basically includes a double-acting air cylinder 330 attached to frame 314. Piston 332 passes through frame 14 and is attached to the pin grasping assembly. The pin grasping assembly includes body portion 334 in which is formed a slot 336. Slot 336 is sized slightly higher and wider than pin head 52. Covering slot 336 and securely attached to body 334 is base plate 338. Base plate 338 is relatively thin and sized to fit under the slightly raised pin head 52. The forward part of base 338 is provided with tapered surfaces to help raise pin head 52 should a problem occur with surface 326. A slot 340 is formed substantially along the length of base plate 338 and is sized wider than the stem or shank portion of pin 36 but not as wide as pin head 52. Thus after tube 32 has been fully inserted by motor 310 into head member 66, pin head 52 will be well within the pin grasping assembly. A retraction of piston 332 will result in pin 36 being pulled from tube 32. As is now apparent, extension of piston 332 will result in the re-insertion of pin 36 in tube 32.

Finger 324 is provided with a slot 342. By passing a bolt 344 through frame 314 and through slot 342, the height or distance by which pin head 52 can be raised is capable of adjustment.

With pin 36 removed, the inclination of tube 32 to a new axial orientation will serve to transfer all DIP devices from tube 32 onto trackway 68. Since it may not be desirable for all DIP devices to be transferred at once, head member 66 is also provided with a singulator station $S_S$. In singulator $S_S$ an L-shaped arm 346 is pivotally attached in slot 348 to body member 350. Spring 352 serves to bias that portion of arm 346 extending towards trackway 68, away from trackway 68. Arm 346 is extended towards trackway 68 and into the path of DIP devices by operation of solenoid 354 mounted to body 350. The piston 356 of solenoid 354 when extended, passes through a bore in body 350 and forces arm 346 into the path of DIP devices. Extension and retraction of piston 356 occurs upon the receipt of a signal generated by the computer control member. Body 350 is attached to frame 314 by height adjustment bolt 358. Adjustment of bolt 358 moves the entire singulator station towards and away from trackway 68 to allow for different thickness DIP bodies. Since adjustment devices of this type are known, details of its assembly have not been discussed.

Figure 16:
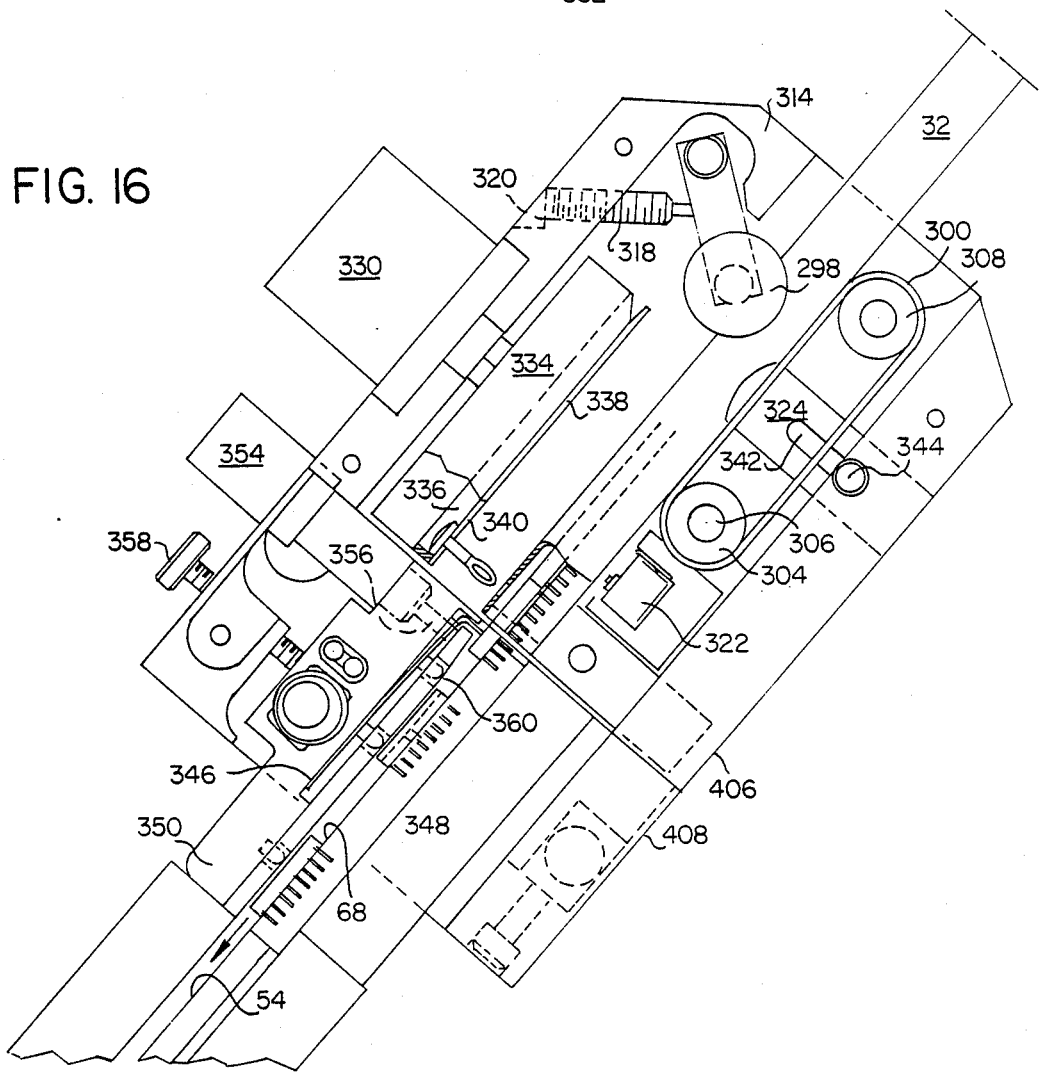
FIG. 16 is a partial sectional view in side elevation of the head assembly after rotation to position the delivery tube in a predetermined orientation with the scanning device.

In order to indicate to the computer control member to raise or lower arm 346, a series of sensors 360 are provided. Depending on the selection of the number of leads per DIP device indicated with dial 80, which will give an indication of the DIP size, one of the sensors will be selected to indicate when a DIP device has passed out of the singulator station so that the next in-line DIP device can be stopped by arm 346. As shown in FIG. 16, once the trailing edge of the DIP device has passed sensor 360, arm 346 has been moved by piston 356 down onto the top of the next succeeding DIP device.

Having considered the operation of head member 66 in relation to transfer tubes sealed with pins 36, consider now operation of head member 66 when such transfer tubes are sealed with plugs 34. Generally, head member 66 is provided with structure which pinches tail 42 and thereafter removes plug 34. The opposite operation results when plug 42 is to be reinserted in tube 32.

Figure 17:
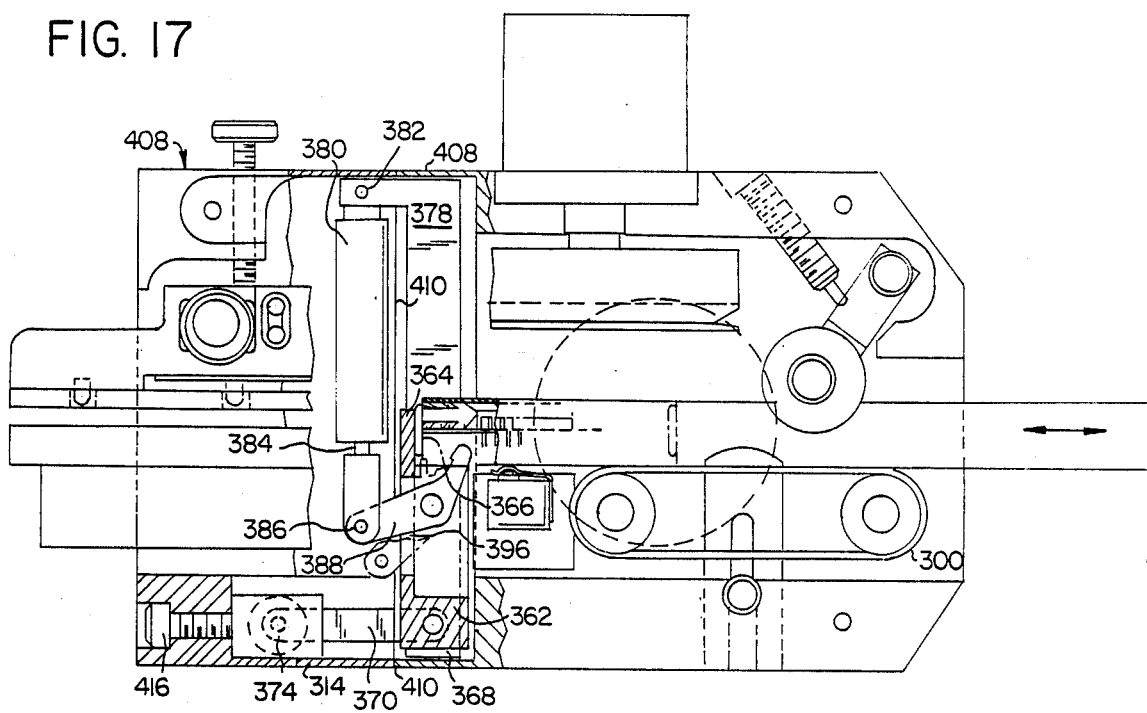
FIG. 17 is a partial sectional view in side elevation of the head assembly illustrating the removal of a cartridge-sealing plug.
Figure 18:
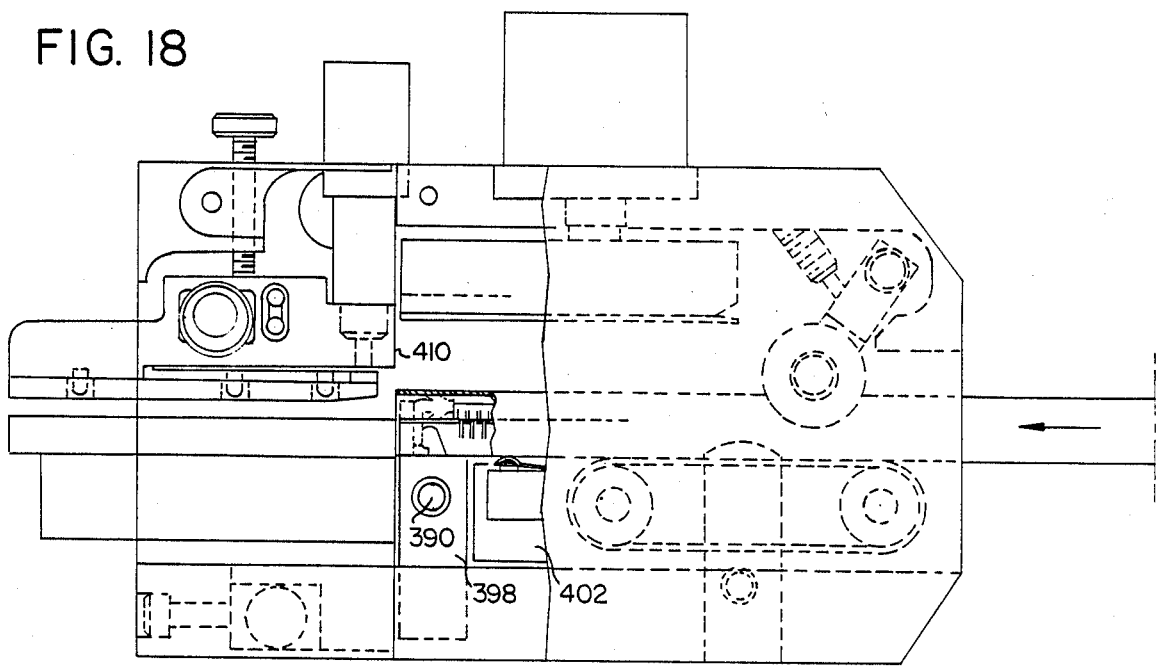
FIG. 18 is a partial sectional view in side elevation of the head assembly illustrating reinsertion of a cartridge-sealing plug.

Referring to FIG. 17, tube 32 having a plug 34 inserted therein has been pulled into head member 66 by belt 300. As will be explained hereafter, pinch bracket 362 has already been positioned in the travel path of tube 32. Pinch bracket 362 includes a pad 364, against which tail 42 of plug 34 is made to abut by belt 300. Tail 42 is pinched and held against pad 364 by rotating finger 366. Once tail 42 is held between finger 366 and 364, reversal of belt 300 results in the removal of plug 34. It is, of course, desirable that the computer control member only move tube 32 that distance necessary to remove plug 34.

Figure 15:
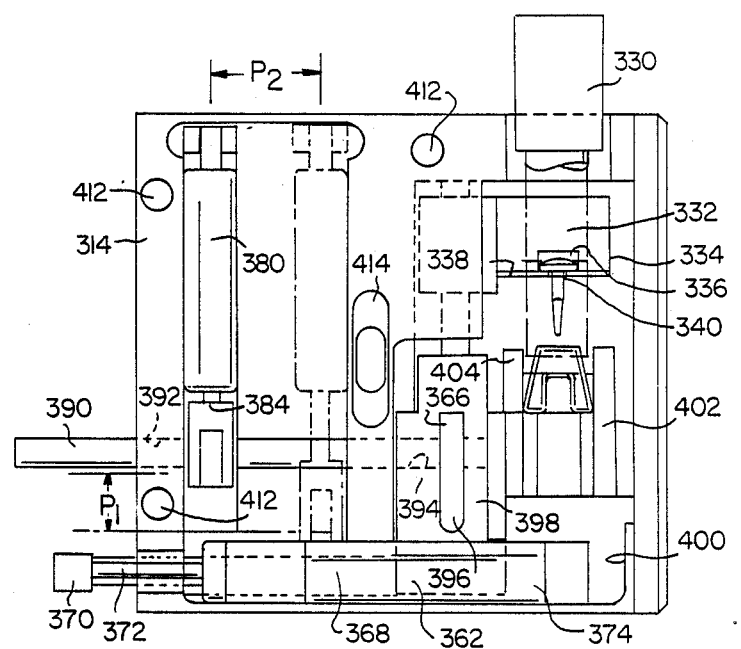
FIG. 15 is a sectional view along line 15—15 of FIG. 14.

Bracket 362 is either mounted upon or formed integral with beam 368, which is mounted to slide in frame 314 in a direction transverse to the travel of tube 32. As shown in FIGS. 13 and 15, beam 368 extends to cross bar 370, which in turn is connected to piston 372 of double-acting air cylinder 374. Cylinder 374 is securely attached to frame 314 by mounting block 376. With this U-shaped arrangement, extension and retraction of piston 372 results in the movement of bracket 362 towards and away from the path of tube 32. Thus, the computer control member is able to move the pad/finger pinch structure into and out of the path of tube 32. For example, having pinched tail 42, belt 300 first moves tube 32 a distance sufficient to remove plug 34, piston 372 thereafter is extended, resulting in the removal of plug 34 from the path of tube 32. Tube 32 can thereafter be moved by belt 300 back into a position abutting trackway 68. With plug 34 removed, DIP devices can be easily transferred.

Movement of finger 366 is achieved through the following structure. Securely mounted to beam 368 is an upstanding bracket 378. Double-acting air cylinder 380 is pivotally connected by pin 382 to bracket 368. The piston 384 of cylinder 380 is pivotally attached by pin 386 to arm 388, which in turn is securely attached to rod 390. As shown in FIG. 15, rod 390 extends through bore 392 in frame 314 and is rotationally and axially slidable in relation thereto. Rod 390 also extends through opening 394 in bracket 362 and is securely attached to finger 366. Finger 366 is shown to be mounted in slot 396 with the terminal end of rod 390 positioned in front wall 398 of bracket 362. Since rod 390 is securely attached to arm 388 and finger 366 it cannot slide axially in relation to bracket 362 or cylinder 380. With the above described arrangement, extension of piston 384 a distance $P_1$ moves arm 388 which in turn rotates rod 390 resulting in the pinching or releasing action of finger 366 and pad 364.

It is also now apparent that extension or retraction of piston 372 results in the movement of bracket 378 a distance $P_2$. Distance $P_2$ must be fixed so that finger 366 extends into and through slot 44 in tube 32 when pinching or releasing tail 42 and so that when not in use or when plug 34 has been removed the entire pad/plug/-finger assembly can be moved out of the path of tube 32. In the preferred embodiment the precise positioning of bracket 362 is accomplished by stop plate 400. In other words, piston 372 will retract until bracket 362 strikes stop plate 400, ensuring the positioning of finger 366. In order to ensure the consistent positioning of slot 44, guide brackets 402 and 404 have been provided. The leading edge of brackets 402 may be tapered to accept slightly non-aligned DIP transfer tubes or bracket 404 may be spring mounted (not shown) to push the edge of tube 32 towards bracket 402. Additional positioning of tube 32 will be achieved through the interaction of finger 324 in slot 44, and spool 298 on the exterior surface of tube 32.

In order to achieve ready access to the interior of head member 66, frame 314 has been divided into two distinct parts 406 and 408, which are joined along line 410. Threaded bolts, not shown in the drawings, are passed through frame half 408 to appropriately threaded bores 412 in frame half 406. In order to transfer the signals from sensors 360, a multi-pin plug 414 is provided. Also in order to provide for the removal of cylinder 374 when frame half 408 is removed, mounting blocks 376 are attached to frame half 408 by bolts 416.

Figure 19:
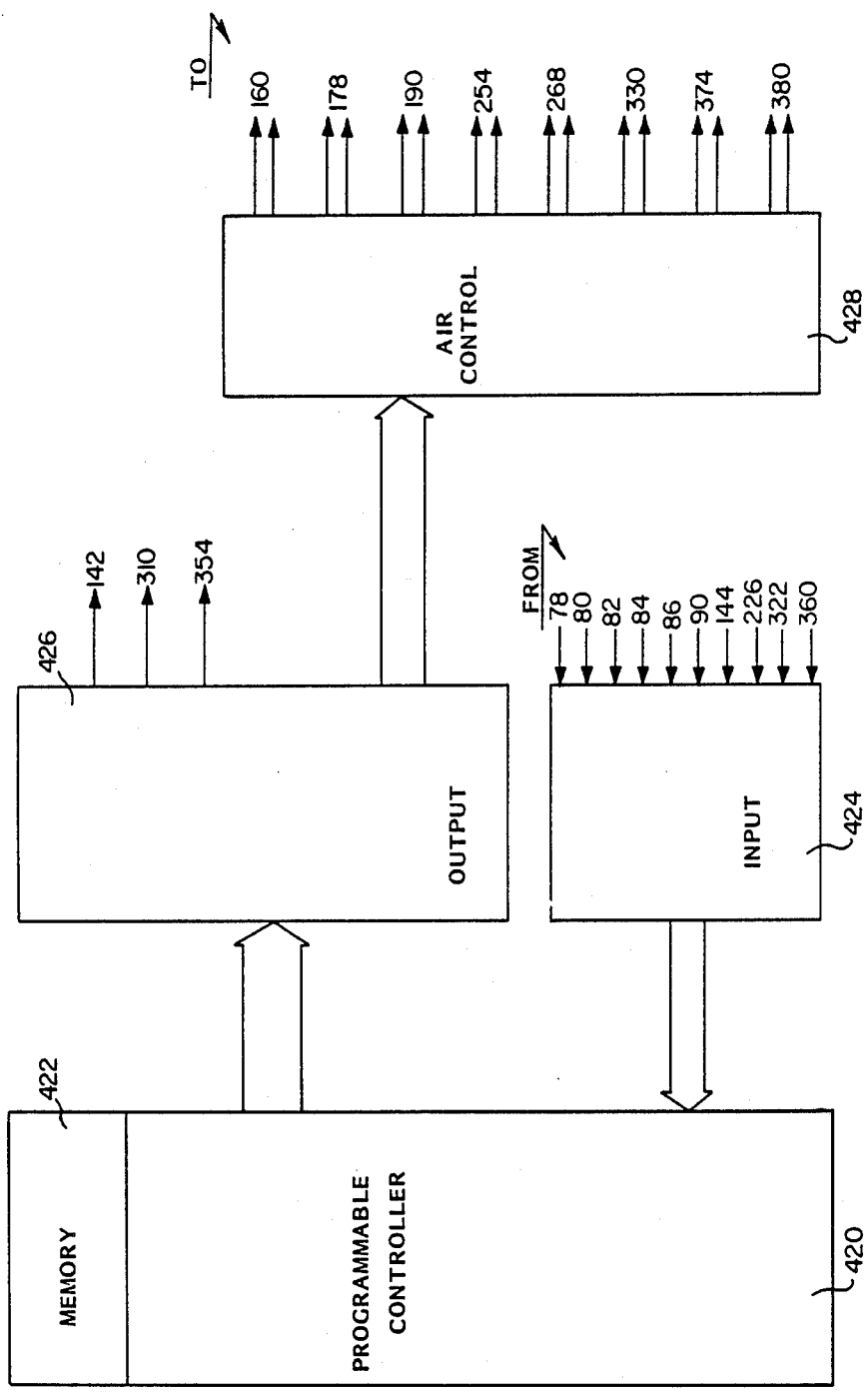
FIG. 19 is a diagrammatic view of the computer control member.

Having repeatedly been mentioned, now consider the computer control member shown diagrammatically in FIG. 19. The computer control member is seen to include a programmable controller 420 which in the preferred embodiment is an Omron 362 S6-CPU-15 manufactured by Omron Tateisi Electronics Co., 9F, Osaka Center Building 468, Kitakyutaro Higashiku, Osaka, 541 Japan and available in the United States from Omron Electronics, Inc., 650 Woodfield, Schaumburg, Ill. 60195. Controller 420 is shown to include a memory component 422, which in the preferred embodiment is an Omron 362 A3-MP 523. Memory 420 has the programming stored therein which is necessary for the operation of loading apparatus 10. Connected to controller 420 is input member 424, which in the preferred embodiment is an Omron 362 A3-OD 411. Also connected to controller 420 is output member 426, which in the preferred embodiment is an Omron 362 A3-OC 221. As is known in the art, I/O devices such as input member 424 and output member 426 are utilized to provide the necessary conversion of signals either to or from controller 420. An air control unit 428 is also provided and connected to output member 426. Air controller 428 basically includes a series of electrically controlled, i.e. solenoid, air valves, at least one for each cylinder described above. Further, although the connection between output member 426 and air controller 428 could be interpreted to represent a bus connection, in the preferred embodiment individual electrical connections are made with each air valve. The thick arrow representation in FIG. 19 is for convenience.

With regard to the input member 424, various input connections are shown which provide the information necessary for the automatic operation of the loading apparatus. Each of the designations listed next to input 424 represent that switch or sensor from which a signal is being received.

Output member 426 is depicted as having multiple connections with air controller 428, a direct connection with solenoid 354, and direct connections with motors 142 and 310. As will be appreciated, the signals from output member 426 to motors 142 and 310 may require further amplification and processing in order to meet the motor manufacturer's requirement. Circuitry for achieving this result has not been shown since it is both well known and freely available.

Although not shown in FIG. 19, it will be understood that air control 428 receives pressurized air from an independent source, which air is directed to the various solenoid valves for delivery to the designated cylinders upon receipt of an appropriate signal from controller 420.

Having described in detail the mechanical and electronic structure of the loading apparatus 10, consider now the programming utilized to carry out a typical cycle of operation. First several manual steps are necessary to set the loader apparatus to transfer particular DIP devices. These steps include turning on the power, filling hopper 58 with tubes, entering the number of leads per DIP device which as mentioned above will indicate what size DIP is being transferred, the number of DIPs per tube so the controller will have an indication of when tube 32 is full or empty, and whether the tube is sealed with a plug 34 or pin 36.

Figure 20:
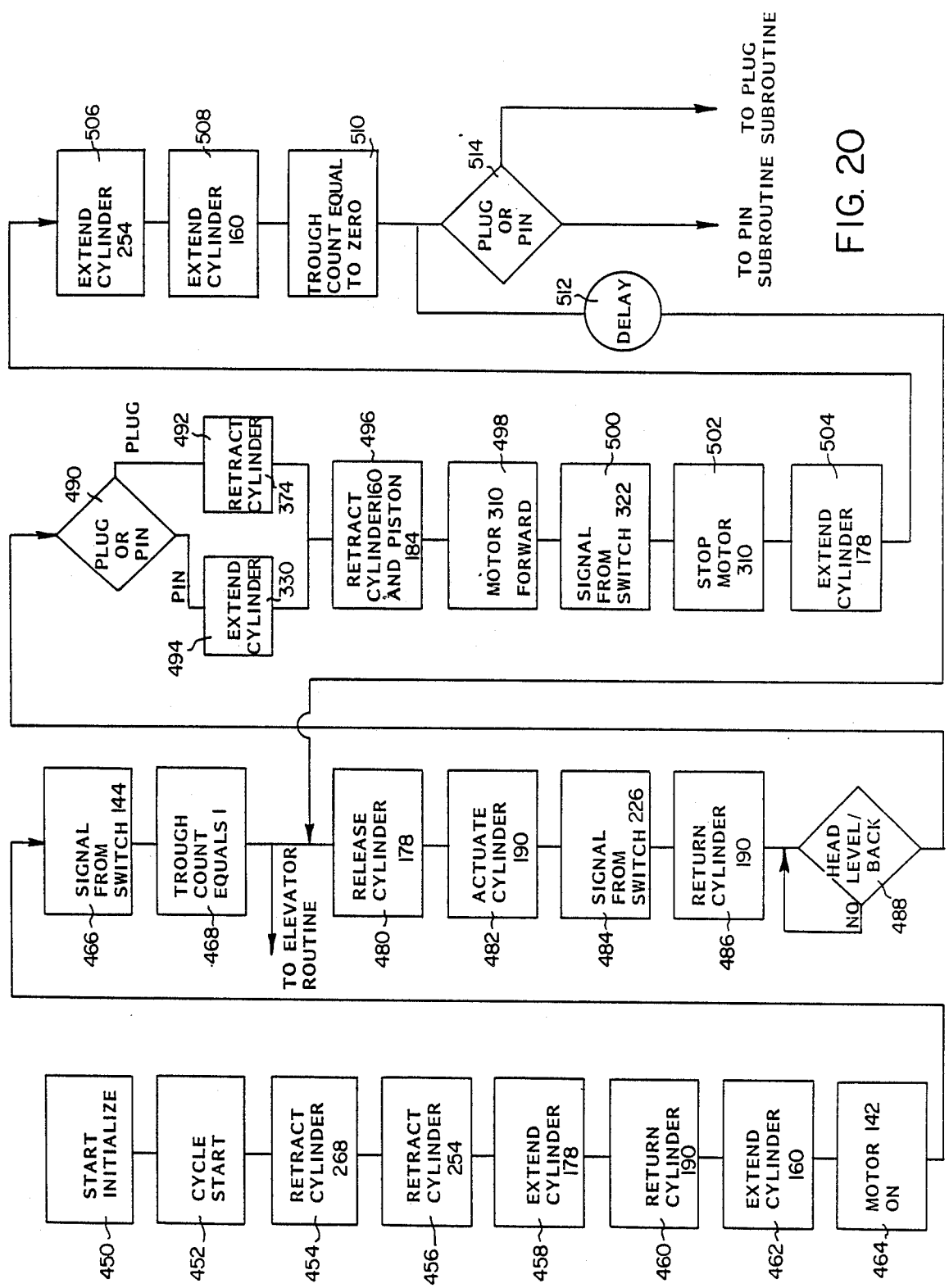
FIG. 20 is a flow chart of the main operation prgram of the programmable controller component of the computer control member shown in FIG. 19.

Once the manual steps have been completed, the programming can be initiated. As shown in FIG. 20, the first step 450 is to initialize controller 420 by pushing start button 78. Upon pressing switch 78, controller 420 sets an internal trough count to zero. The trough count is reflective of a tube having been deposited in trough 64.

Since loader 10 can only operate on one tube at a time the trough count will always be either zero or one after initialization, a loader cycle is begun by depressing switch 90 at step 452.

In order to ensure the initial position of head member 66, controller 420 at step 454 next makes the head "level", i.e. trackway 68 and belt 300 are substantially co-planar with rough bottom 154, by generating a signal which retracts piston 280 of cylinder 268. Controller 420 at step 456 next generates a signal which retracts piston 264 of cylinder 254 to move head member 66 back and which axially aligns opening 158 with spool 298 and belt 300. The controller next generates a signal at step 458 which extends piston 184 of cylinder 178 moving orientor station $S_{RO}$ within cover 170 and providing tension in spring 186.

At step 460 rotary cylinder 190 is made to rotate to its "home" position, which as previously described orients key 194 in a vertical direction relative to trough 64, as shown in FIG. 12. Finally at step 462, piston 162 of cylinder 160 is extended to position stop plate 152 over opening 158. Trough 64 is now ready for the reception of the first tube 32.

Figure 21:
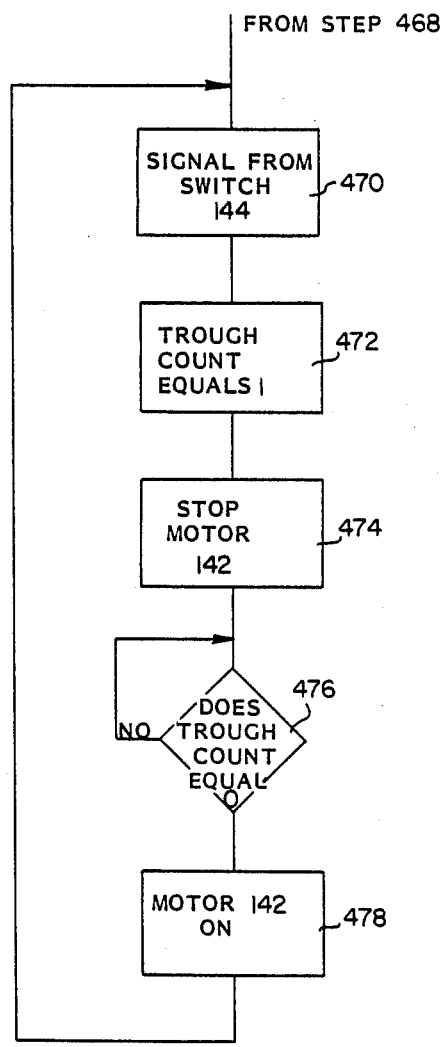
FIG. 21 is a flow chart of the elevator sub-routine program of the main program shown in FIG. 20.

Elevator motor 142 is turned on in step 464, which results in the movement of hook members 60 through hopper 58 raising a tube 32 to arm 148 of switch 144. Upon receiving a signal from switch 144 at step 466 that a tube has made contact with arm 148, controller 420 next sets the trough count to one at step 468, since a tube will now be deposited in trough 64. Elevator station $S_E$ is now controlled through a looping sub-routine shown in FIG. 21. As shown in such sub-routine, elevator motor 142 continues to operate raising the next tube to arm 148. Upon receipt of a signal from switch 144 at step 470, controller 420 again sets the trough count equal to one at step 472 and stops motor 142 at step 474. With motor 142 stopped, a tube 32 is in a ready position at the curved top portion 146 but is not yet deposited into trough 64. Controller 420 at step 476 will continually determine whether the trough count equals zero. As will be explained herein, when the trough count is finally changed to zero, controller 420 re-starts motor 142 at step 478 and returns to step 470 in the sub-routine. As will be appreciated, this sub-routine will loop continuously until the loader is turned off.

Returning to the main operating program of FIG. 20, controller 420 at step 480 releases the air pressure on cylinder 178 so that spring 186 can operate to move the orientor station $S_{RO}$ in contact with the end of tube 32. At step 482, rotary cylinder 190 is made to rotate collar 164. Once key 194 fits into slot 44 and the end of tube 32 strikes plate 214, switch 226 sends a signal to controller 420 which results in rotary cylinder 190 being returned to its home position at step 486. Once tube 32 is oriented by returning cylinder 190 to its home position, controller 420 next determines at step 488 whether it has made head member 66 level and moved it back into alignment with opening 158. If head member 66 is level and back, controller 420 next determines at step 490 whether a pin or plug seal has been set by switch 86.

If switch 86 has been set for plug seals, controller 420 retract at step 492 piston 372 of cylinder 374 moving pinching bracket 362 into the path of tube 32. If switch 86 has been set for pin seals, controller 420 at step 494 extends piston 332 of cylinder 330 to move the pin grasping assembly towards the path of tube 32. At this point, controller 420 at step 496 retracts piston 162 of cylinder 160, removes stop plate 152 from opening 158 and simultaneously retracts piston 184. Spring 186 now contracts to move the end of tube 32 through opening 158 and into contact with spool 298 and belt 300. Controller 420 at step 498 actuates motor 310 to move belt 300 "forward", pulling tube 32 into head member 66. When controller 420 receives a signal from switch 322 at step 500 it stops motor 310 at step 502.

With motor 310 stopped, controller 420 at step 504 extends piston 178 moving orienting station $S_{RO}$ back into cover 170. With collar 164 now removed from tube 32, controller 420 at step 506 extends piston 264 of cylinder 254, which results in the transverse movement of tube 32 out of trough 64. With tube 32 out of trough 64, piston 162 of cylinder 160 is again extended at step 508, moving stop plate 152 into opening 158. Since trough 64 is now empty, controller 420 at step 510 sets the trough count equal to zero. With the trough count equal to zero, the loop sub-routine in FIG. 21 now moves to step 478 resulting in the depositing of the next tube 32 into trough 64. After a suitable delay at step 512 controller 420 will go back to step 480 where it will execute to step 488. At step 488 a tube 32 will be oriented and controller 420 will wait for the appropriate point in the sub-routines shown in FIGS. 22 and 23 when head member 66 is made level and moved back. It is recognized that the programming associated with the orientor station $S_{RO}$ may be written as a sub-routine since it will run concurrently with later portions of the program outlined in FIG. 20.

At step 514, controller 420 determines whether pin or plug seals have been selected by switch 86. Assuming that switch 86 has been set for pin seals, controller 420 at step 516 sets a DIP count equal to the number of DIP devices per tube set by switch 82. At step 518, cylinder 330 is made to retract piston 332, pulling pin 36 from tube 32. With pin 36 removed, controller 420 at step 520 extends piston 280 of cylinder 268. Such extension results in the inclined orientation of tube 32. As soon as the leading edge of a DIP body is sensed by one of the sensors 360 a signal reflecting such leading edge at such sensor is received by controller 420 at step 522. Controller 420 generates a signal extending the piston of solenoid 354 at step 524, which results in the movement of arm 346 stopping the flow of DIP devices. When controller 420 receives a signal from sensor 360 that the trailing edge of the freely moving DIP has passed, controller 420 reduces the DIP count by one at step 528 and retracts the piston of solenoid 354 at step 530. The controller next determines at step 532 if the DIP count equals zero. If the DIP count does not equal zero, controller 420 returns to step 522. When the DIP count equals zero, controller 420 at step 534 extends piston 332 of cylinder 330, reinserting pin 36 into tube 32. At step 536, controller 420 actuates motor 310 to move belt 300 in a reverse direction, ejecting tube 32, which falls into bin 74 shown in FIG. 1. With tube 32 ejected, controller 420 makes head member 66 level and moves head member 66 back, i.e. pistons 280 and 264 are retracted. With head member 66 level and back, controller 420 returns to step 488 where it processes the next tube 32.

A further feature of the loader 10, lies in the provision of a one second delay after step 522. If no leading edge is sensed during the one second delay, controller 420 pulses cylinder 268 which results in a quick jerk movement of tube 32 to dislodge a stuck DIP device. If no leading edge is sensed within another second, controller 420 proceeds to step 534. This same feature exists with reference to the plug pulling routine.

Figure 23:
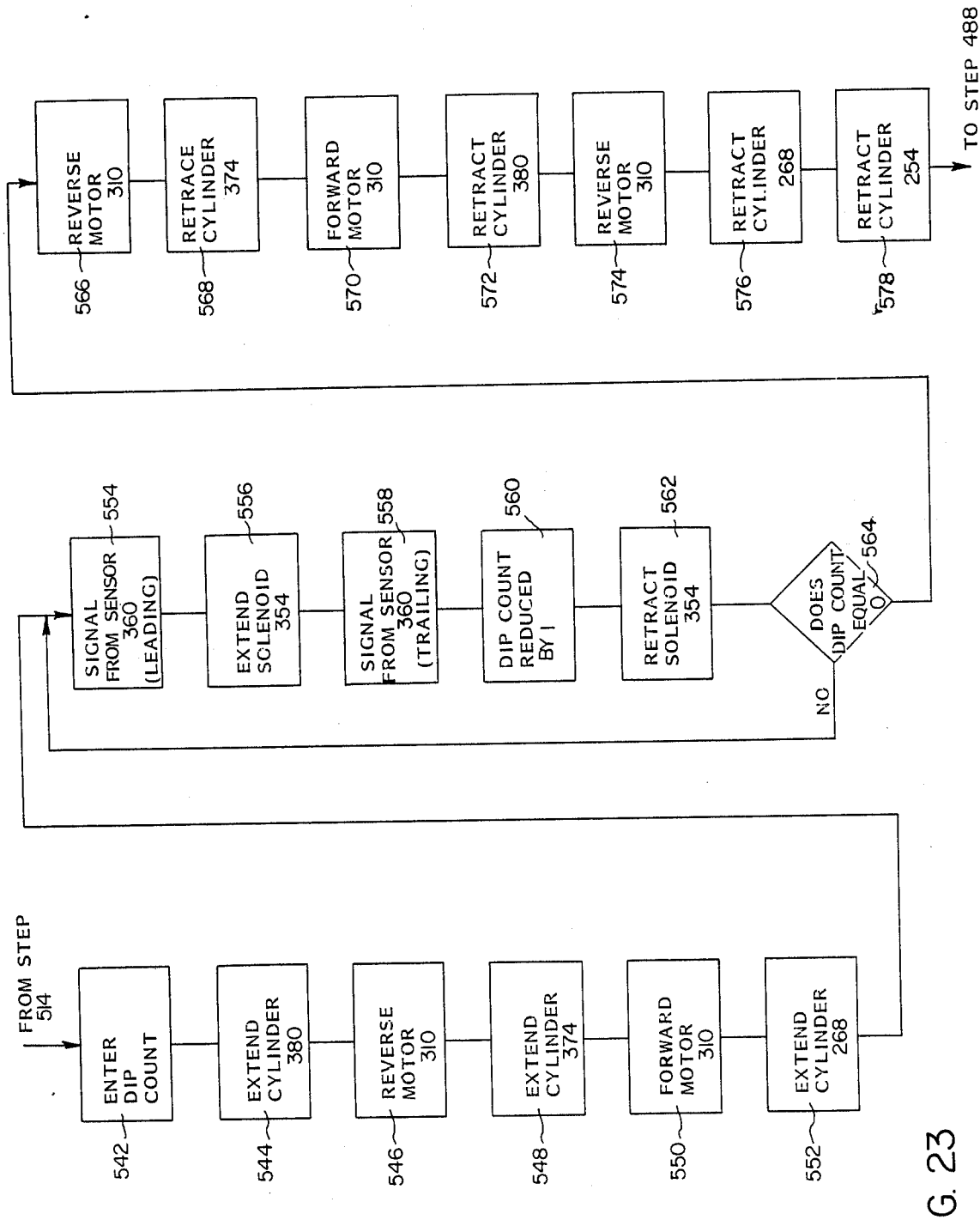
FIG. 23 is a flow chart of the plug pulling sub-routine program of the main program shown in FIG. 20.

If the plug seal indication has been made by switch 86, controller 420 at step 514 proceeds with the plug pulling sub-routine shown in FIG. 23. Controller 420 sets the DIP count to that entered with switch 82 at step 542. Having already retracted piston 372 at step 492, controller 420 at step 544 extends piston 384 of cylinder 380, moving finger 366, pinching tail 42 between finger 366 and pad 364. With plug 34 so pinched, controller 420 at step 546 reverses motor 310 for a short time. Tube 32 is moved only that distance necessary to be removed from plug 34. Controller 420 next extends piston 372 of cylinder 374, moving the now held plug 34 out of the path of tube 32. At step 550, controller 420 moves tube 32 forward again via motor 310 to position tube 32 adjacent trackway 68. With the now unsealed tube so positioned, controller 420 at step 552 extends piston 280 of cylinder 268 raising the free end of tube 32.

Figure 22:
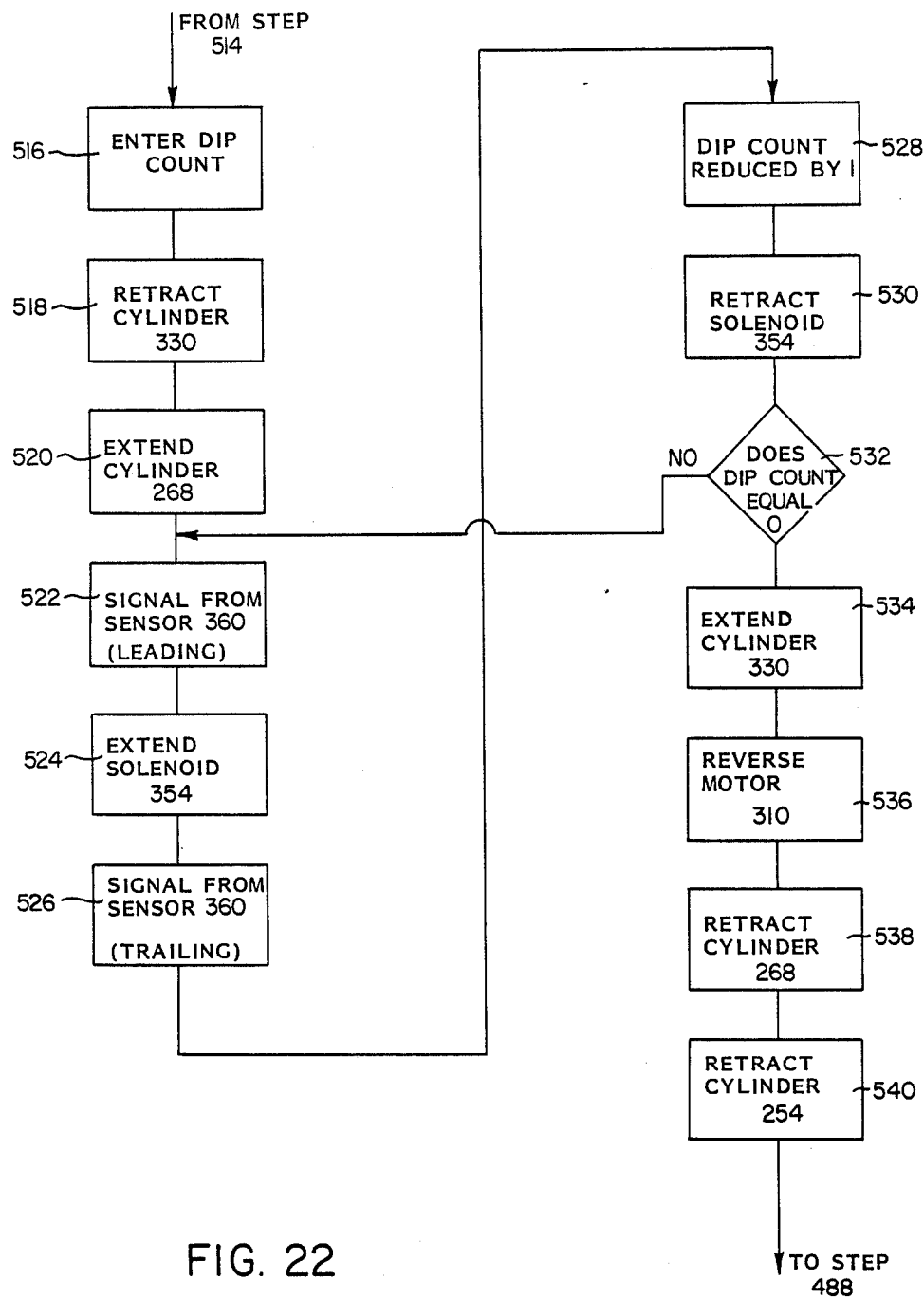
FIG. 22 is a flow chart of the pin pulling sub-routine program of the main program shown in FIG. 20.

Steps 554 through 564 of FIG. 23 are identical and are executed identically to steps 522 through 532 of FIG. 22. After all DIP devices have been removed from tube 32, controller 420 at step 566 reverses motor 310 for the same short time as that in step 546. At step 568 piston 372 is retracted, moving pinched plug 34 back into the path of tube 32. Controller 420 at step 570 moves tube 32 onto plug 34 by motor 310. Piston 384 of cylinder 380 is retracted in step 572, releasing tail 42. With plug 34 now released, motor 310 is again actuated in the reverse direction by controller 420 to eject tube 32 at step 574. With tube 32 now ejected controller 420 at steps 576 and 578 moves head member 66 to its back and level position by retracting pistons 280 and 264. With head member 66 level and back, controller 420 returns to step 488 where it processes the next tube 32.

While particular embodiments of the present invention have been illustrated and described herein, it is not intended to limit the invention and changes and modifications may be made therein within the scope of the following claims. For example, although the apparatus has been primarily described in terms of transferring DIP devices from tubes 32, it will be appreciated that by loading empty tubes into hopper 58 and adjusting arm 70 to axially orient head member 66 and tube 32 into a downwardly inclined orientation, tubes 32 could be filled with DIP devices.

What is claimed is:

1. An apparatus for the transfer of DIP devices to or from DIP delivery tubes, comprising:
   a hopper for storage of a plurality of said tubes;
   a trough for receiving said tubes;
   orienting means for removing individual tubes from said hopper, for orienting said tubes to a predetermined first orientation, and for moving said tube in a direction in response to a first signal, said orienting means comprises elevator means for removing individual tubes from said hopper and for placing said tubes in said trough, an orienting collar having indexing means formed therein and means for positioning said collar on said tube after it has been placed in said trough and means for rotating said collar to a predetermined radial orientation such that said indexing means provides a predetermined radial orientation to said tube;
   head means for receiving said tubes from said orienting means and for guiding said tubes to a predetermined second orientation in response to a second signal and for ejecting said tubes in response to an ejection signal; and
   control means operatively associated with said orienting means and head means to generate said first, second and ejection signals, so that said tubes are moved by said orienting means to said head means for the transfer of DIP devices to or from said tubes and followed by the ejection of said tube.

2. The apparatus of claim 1, wherein said hopper is located on the side of said apparatus opposite said orienting means.

3. The apparatus of claim 1, wherein said DIP delivery tubes contain seal members in each end and wherein said head means further comprises extracation means for removing one of said seal members such that when said tubes are guided to said second orientation, DIP devices may be freely transferred.

4. A method for transferring DIP devices to or from DIP delivery tubes stored in a storage hopper, comprising the steps of:
   removing individual tubes from said storage hopper and orienting said tubes in a predetermined first orientation;
   moving said tubes from said first orientation to a head means, and positioning said tubes in a predetermined second orientation;
   transferring DIP devices into or out of said tubes at said second orientation;
   removing individual tubes from said hopper by an elevator means adapted to place said individual tubes in a trough, and positioning an orienting collar on the tube after it has been placed in said trough, said collar having indexing means formed therein to rotate said collar to a predetermined radial orientation to achieve said predetermined first orientation of said tubes; and
   ejecting said tubes from said head means.

5. The method of claim 4 which further includes generating a first signal from a control means in response to said tube achieving said first predetermined orientation.

6. The method of claim 4 which further includes generating a second signal from a control means in response to said tube achieving said second predetermined orientation.

7. The method of claim 4 which further includes generating an ejection signal from a control means upon completion of said transferring into or out of said tube.

8. The method of claim 4 which further includes providing seal members in each end of said DIP delivery tubes, said head means being adapted to remove one of said seal members during said transferring step.

9. The method of transferring DIP devices to or from DIP delivery tubes stored in a storage hopper, comprising the steps of:
   removing individual tubes from said storage hopper and orienting said tubes in a predetermined first orientation;
   generating a first signal in response to said tube achieving said predetermined first orientation;
   moving said tube in response to said first signal in a predetermined direction to a head means for receiving said tube;
   generating a second signal in response to moving said tube to cause said head means to guide said tubes to a predetermined second orientation;
   transferring DIP devices into or out of said tube at said second orientation; and
   generating an ejection signal to eject said tubes from said head means,
   removing individual tubes from said hopper by an elevator means adapted to place said individual tubes in a trough, and positioning an orienting collar on the tube after it has been placed in said trough, said collar having indexing means formed therein to rotate said collar to a predetermined radial orientation to achieve said predetermined first orientation of said tubes.

10. The method of claim 9 which further includes providing seal members in each end of said DIP delivery tubes, said head means being adapted to remove one of said seal members during said transferring step.

11. A system for transferring DIP devices to or from DIP delivery tubes stored in a storage hopper comprising:
   orienting means for removing individual tubes from said storage hopper, said orienting means being adapted to place said tubes in a predetermined first orientation and generate a first signal in response to said tube achieving said first orientation;
   control means for receiving and sending signals, said control means being adapted to receive said first signal and cause said orienting means to move said tube in a direction from said first orientation to a second predetermined orientation;
   head means for receiving said tubes from said orienting means and for positioning said tubes at said second predetermined orientation and generating a second signal, said control means being responsive to said second signal from said head means for causing transfer of DIP devices into or out of said tube at said second orientation; and
   ejection means operably connected to said control means for receiving a signal from said control means upon completion of said transferring of DIP devices into or out of said tube and adapted to eject said tube from said head means in response to an ejection signal from said control means,
   a trough and wherein said orienting means comprises elevator means for removing individual tubes from said hopper and for placing said tubes in said trough, an orienting collar having indexing means formed therein and means for positioning said collar on said tube after it has been placed in said trough and means for rotating said collar to a predetermined radial orientation such that said indexing means provides a predetermined radial orientation to said tube.

12. The system of claim 11, wherein said hopper is located on the side of said apparatus opposite said orienting means.

13. The system of claim 11, wherein said DIP delivery tubes contain seal members in each end and wherein said head means further comprises extrication means for removing one of said seal members such that when said tubes are guided to said second orientation, DIP devices may be freely transferred.

14. In a system for transferring devices to or from delivery tubes, an orientor mechanism for transferring delivery tubes from a hopper to a head assembly comprising a collar means for moving the orientor assembly axially between limit positions, indexing means in the form of radially inwardly directed key engageable in the slot of the delivery tubes and means for rotating the collar to orient a delivery tube in a predetermined radial position.

15. In a system for handling delivery tubes having fasteners at least at one end for holding devices therein for processing, from an accumulator station to a scanning or straightening mechanism, a housing having a tube input end and a device output end including a trackway projecting therefrom, means for advancing delivery tubes through said housing to position them at the entrance end of a scanning or straightening mechanism, and means during the course of movement of said delivery tube through said system to engage and remove a fastener at one end of said tube, said means operable upon discharge of devices to reassemble said fastener.

16. In a system as claimed in claim 15, wherein said delivery tube advancing means comprises an endless belt and associated drive means and a rotatable spool mechanism to press the incoming delivery tube against the drive belt.

17. In a system as claimed in claim 16, including switch means downstream of said tube input end engageable by a tube and operable to stop actuation of said tube drive means positioning said tube at a predetermined location.

18. In a system as claimed in claim 16, including a finger in the path of an incoming tube projecting above the upper run of said endless belt engageable with the fastener at said one end of the tube to raise the same and permit removal by a pin-pulling mechanism.

19. In a system as claimed in claim 18, wherein said pin-pulling mechanism includes a body portion having an elongated slot of a cross section higher and wider than said fastener head and a base plate engageable under the fastener head having a tapered surface coacting with the fastener head to remove the fastener during movement of the tube to said predetermined location.

* * * * *